(12) United States Patent
Ohmi et al.

(10) Patent No.: US 6,475,323 B1
(45) Date of Patent: Nov. 5, 2002

(54) METHOD AND APPARATUS FOR SEPARATING COMPOSITE MEMBER USING FLUID

(75) Inventors: Kazuaki Ohmi, Yokohama; Takao Yonehara, Atsugi; Kiyofumi Sakaguchi; Kazutaka Yanagita, both of Yokohama, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/721,816

(22) Filed: Nov. 24, 2000

Related U.S. Application Data

(63) Continuation of application No. 09/047,327, filed on Mar. 25, 1998, now Pat. No. 6,382,292.

(30) Foreign Application Priority Data

Mar. 27, 1997 (JP) ............................................. 9-075498
May 28, 1997 (JP) ............................................. 9-138477

(51) Int. Cl.⁷ .............................................. B32B 35/00
(52) U.S. Cl. ..................... 156/239; 156/344; 156/529; 156/584; 83/177; 29/426.4; 438/458
(58) Field of Search ................................ 156/239, 344, 156/529, 584; 83/177; 29/426.4, 426.5; 438/455, 458

(56) References Cited

U.S. PATENT DOCUMENTS 4,965,879 A  10/1990  Goesele et al. ............. 228/116

(List continued on next page.)

FOREIGN PATENT DOCUMENTS

| EP | 0 451 993 | 10/1991 |
|---|---|---|
| EP | 0 562 764 | 9/1993 |
| EP | 0 709 876 | 5/1996 |
| EP | 0 757 377 | 2/1997 |
| EP | 0 763 849 | 3/1997 |
| EP | 0 886 300 | 12/1998 |
| EP | 0 925 887 | 6/1999 |
| EP | 0 925 888 | 6/1999 |
| EP | 0 926 709 | 6/1999 |
| EP | 0 938 129 | 8/1999 |
| FR | 2 699 852 | 7/1994 |
| JP | 57-45934 | 3/1982 |
| JP | 2-106300 | 4/1990 |
| JP | 5-21338 | 1/1993 |
| JP | 7-302889 | 11/1995 |
| JP | 9-8095 | 1/1997 |
| JP | 9-167724 | 6/1997 |
| KR | 97-0023665 | 5/1997 |
| WO | 81/02948 | 10/1981 |

OTHER PUBLICATIONS

K. Imai, "Crystalline Quality of Silicon Layer Formed by FIPOS Technology", J.Crys. Growth, vol. 63, pp. 547–553 (1983).

"Water Jet", J. Water Jet Tech., vol. 1, No. 1, p. 4 (1984).

Patent Abstracts of Japan, vol. 1997, No. 05, May 30, 1997 (corresponds to JP 9–008095).

Patent Abstracts of Japan, vol. 1999, No. 07, Mar. 31, 1999 (corresponds to JP 9–167724).

*Primary Examiner*—Mark A. Osele
(74) *Attorney, Agent, or Firm*—Fitzpatrick, Cella, Harper & Scinto

(57) ABSTRACT

To separate a composite member consisting of a plurality of bonded members without destructing or damaging it, a fluid is jetted against the composite member from a nozzle to separate it into a plurality of members at a position different from a bonding position.

24 Claims, 20 Drawing Sheets

U.S. PATENT DOCUMENTS

| | | | |
|---|---|---|---|
| 5,155,946 A | 10/1992 | Domann | 51/410 |
| 5,213,451 A | 5/1993 | Frank et al. | 406/72 |
| 5,255,853 A | 10/1993 | Munoz | 239/433 |
| 5,371,037 A | 12/1994 | Yonehara | 437/86 |
| 5,374,564 A | 12/1994 | Bruel | 437/24 |
| 5,447,596 A | 9/1995 | Hayase | 156/584 |
| 5,588,994 A | 12/1996 | Bozler et al. | 117/89 |
| 5,605,492 A | 2/1997 | Klingel | 451/40 |
| 5,714,395 A | 2/1998 | Bruel | 437/584 |
| 5,783,022 A | 7/1998 | Cha et al. | 156/344 |
| 5,811,348 A | 9/1998 | Matsushita et al. | 438/455 |
| 5,854,123 A | 12/1998 | Sato et al. | 438/507 |
| 5,856,229 A | 1/1999 | Sakaguchi et al. | 438/406 |
| 5,863,830 A | 1/1999 | Bruel et al. | 438/478 |
| 5,966,620 A | 10/1999 | Sakaguchi et al. | 438/455 |
| 5,994,207 A | 11/1999 | Henley et al. | 438/515 |
| 6,054,363 A | 4/2000 | Sakaguchi et al. | 438/406 |
| 6,100,165 A | 8/2000 | Sakaguchi et al. | 438/455 |
| 6,100,166 A | 8/2000 | Sakaguchi et al. | 438/455 |

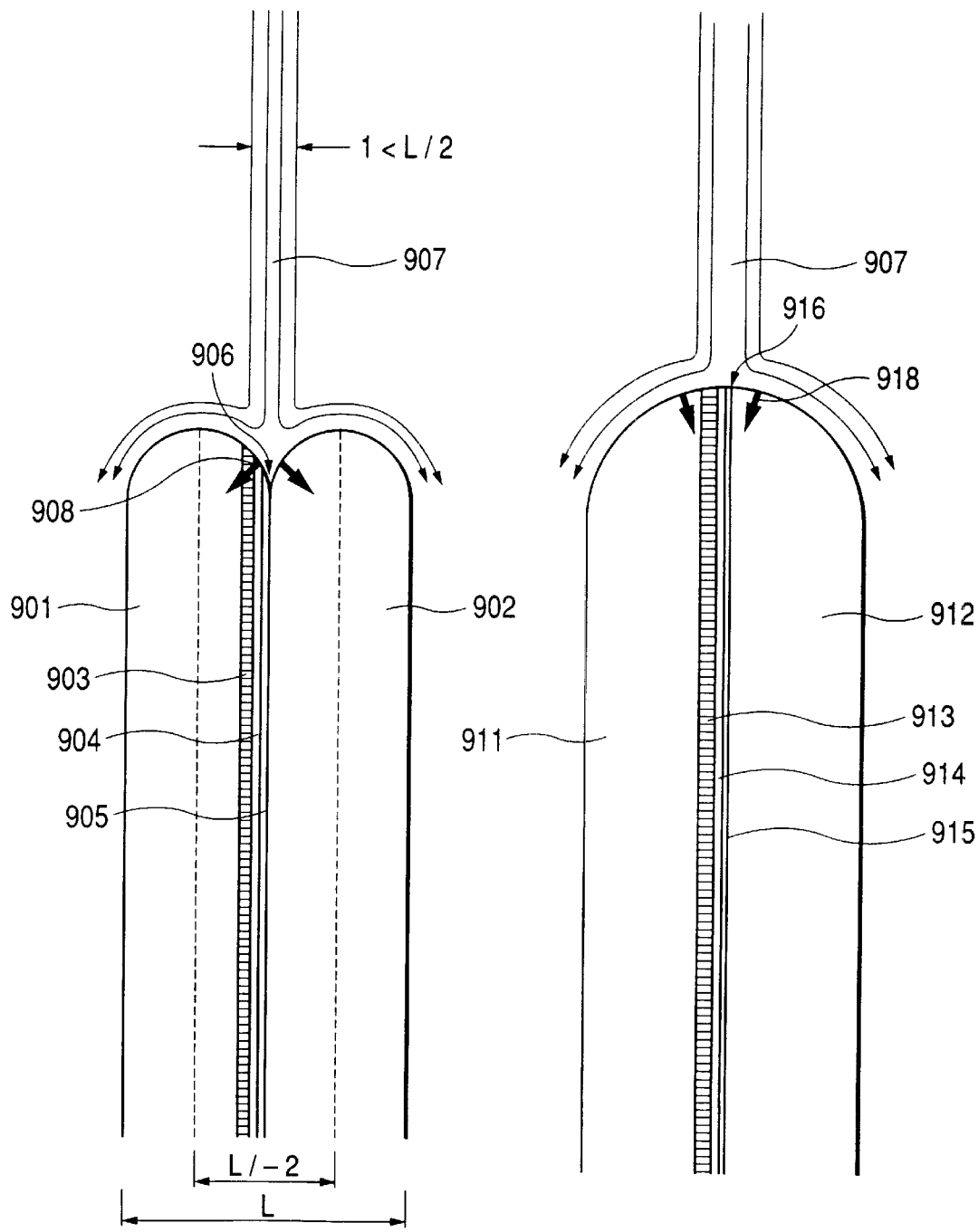

METHOD AND APPARATUS FOR SEPARATING COMPOSITE MEMBER USING FLUID

This is a continuation of application Ser. No. 09/047,327 filed Mar. 25, 1998, now U.S. Pat. No. 6,382,292.

BACKGROUND OF THE INVENTION

1. Field of the Invention

The present invention relates to a method and apparatus for separating a composite member, separated members, and a semiconductor substrate and its production method.

2. Related Background Art

The formation of a single crystal Si semiconductor layer on an insulating surface of a substrate is widely known as a semiconductor on insulator (SOI) technique, and many efforts have been made to research this technique because devices produced using the SOI technique have many advantages that cannot be achieved by bulk Si substrates used to fabricate normal Si integrated circuits.

The use of the SOI technique provides the following advantages:

(1) The dielectric separation can be easily made to attain high integration.
(2) Radiation resistance is excellent.
(3) The stray capacity is reduced to attain high speed.
(4) The well formation process can be omitted.
(5) Latch-up can be prevented.
(6) The thickness can be reduced to provide a fully depleted field effect transistor.

To achieve the many advantages of the device, methods for forming SOI structures have been researched for decades. One of such known methods is SOS (silicon on sapphire) in which Si is heteroepitaxially formed by CVD (chemical vapor deposition) on a single crystal sapphire substrate. This technique has been successful as the maturest SOI technique, but its applications are limited by a large amount of crystal defects due to the misalignment of lattices in the interface between an Si layer and a sapphire substrate, by the mixture of aluminum from the sapphire substrate into the Si layer, and in particular, by the high costs of the substrate and the still insufficient the enlargement of area of the device. More recently, an attempt has been made to implement an SOI structure without the sapphire substrate. This attempt can be roughly classified into the following two methods.

1. After the surface of an Si single crystal substrate is oxidized, a window is made in the oxidized film to expose a part of t he surface of the Si substrate, and this part is used as a seed to allow a horizontal epitaxial growth to form an Si single crystal layer on the $SiO_2$ (in this case, an Si layer is deposited on $SiO_2$).

2. The Si single crystal substrate is used as an active layer and $SiO_2$ is formed under this layer (this method does not require an Si layer to be deposited).

Known means for realizing the above method 1 include a method for allowing the direct horizontal epitaxial growth of single crystal layer Si using CVD, a method of depositing amorphous Si and allowing its horizontal epitaxial growth in a solid phase by thermal treatment, a method of irradiating an amorphous or polycrystal Si layer with converging energy beams such as electron or laser beams, and allowing a single crystal layer to grow on $SiO_2$ by means of melting recrystallization, and a method of using a bar-like heater to scan a molten area in such a way that the scanning trace appears like a band (zone melting recrystallization). Although these methods have both advantages and disadvantages, they still have many problems in terms of their controllability, productivity, uniformity, and quality and none of them have been put to industrially practical use. For example, the CVD method requires sacrificial oxidization to provide flat films. The solid phase growth method provides poor crystallinity. The beam anneal method has problems in terms of the time required for converging-beam scanning, and control of the superposition of beams, and focusing. Among them, the zone melting recrystallization method is maturest and has been used to produce relatively-large-scale integrated circuits on an experimental basis, but it still causes a large amount of crystal defects such as sub-grains to remain in the device, thereby failing to fabricate minor-carrier devices and to provide sufficiently excellent crystals.

The above method 2 that does not use the Si substrate as a seed for epitaxial growth includes the following four methods.

(1) An oxide film is formed on an Si single crystal substrate with a V-shaped groove etched anisotropically in its surface, a polycrystal Si layer is deposited on the oxide film so as to be as thick as the Si substrate, and then an Si single crystal region surrounded by the V-shaped groove so as to be separated dielectricly is formed on the thick polycrystal Si layer by polishing from the rear surface of the Si substrate. This method provides excellent crystallinity but the steps for depositing polycrystal Si by a thickness of several hundred microns and polishing the single crystal Si substrate from its rear surface to leave only the separated Si active layer have problems in terms of controllability and productivity.

(2) SIMOX (Separation by Ion-Implemented Oxygen) that forms an $SiO_2$ layer in an Si single crystal substrate by means of oxygen ion implantation and that is the presently maturest technique due to its excellent compatibility with the Si process. To form an $SiO_2$ layer, however, $10^{18}$ ions/cm$^2$ or more of oxygen ions must be implanted, resulting in the need for a large amount of time for the implantation, thereby leading to reduced productivity. In addition, the costs of wafers are high. Furthermore, this method cause a large amount of crystal defects to remain in the device and does not industrially provide a sufficient quality to fabricate minor-carrier devices.

(3) A method for forming an SOI structure by dielectric separation through the oxidization of porous Si. In this method, an N-type Si layer is formed like an island on a surface of a P-type Si single crystal substrate by proton-ion implantation (Imai et al., J. Crystal Growth, vol. 63, 547 (1983)) or by epitaxial growth and patterning. Only the P-type Si substrate is made porous by an anodization method using an HF solution in such a way that the porous region surrounds the Si island from the surface, and the N-type Si island is then oxidized at a high speed for dielectric separation. In this method, the separating Si region is determined prior to the device step, thereby limiting the degree of freedom of device design.

(4) A method for forming an SOI structure using thermal treatment or an adhesive to bond an Si monocrystal substrate on a different Si single crystal substrate that is thermally oxidized is attracting attention. This method requires an active layer for a device to be formed as a uniformly thin film. That is, the thickness of a several-hundred-micron-thick Si single crystal substrate must be reduced to the order of micron or less.

The following two methods can be used to provide a thinner film.

1) Thickness reduction by polishing
2) Thickness reduction by selective etching

The polishing in 1) cannot provide uniformly thin films easily. In particular, if the thickness is reduced to the order of submicron, the thickness variation will be several tens %, resulting in a serious problem for providing uniformity. The difficulty in achieving uniformity further increases with increasing size of the substrate.

In addition, although the etching in 2) is supposed to be effective in providing uniform thin films, it has the following problems.

The selection ratio is at most $10^2$ and is insufficient.
The surface obtained after etching is bad.
The crystallinity of the SOI layer is bad due to the use of ion implantation or epitaxial or heteroepitaxial growth on a high concentration B-doped Si layer.

A semiconductor substrate formed by bonding requires two substrates, one of which is mostly uselessly removed and disposed of through polishing and etching, thereby wasting limited global resources. Thus, SOI with bonding presently has many problems in terms of its controllability, uniformity, and costs.

In addition, generally due to the disorder of the crystal structure of a light-transmissive substrate represented by glass, a thin film Si layer deposited on the substrate can only form an amorphous layer or a polycrystal layer based on the disorder of substrates, and therefore high-performance devices cannot be produced. This is because since amorphous structure of the substrate is amorphous, an excellent single crystal layer cannot be obtained by simply depositing an Si layer. The light-transmissive substrate is important in producing a contact sensor or a projection liquid-crystal image display device that is a light-receiving element. Not only the improvement of pixels but also a high-performance drive element are required to attain higher density, higher resolution, and finer definition of the pixels in the sensor or display device. Thus, to provide elements on the light-transmissive substrate, a single crystal layer of an excellent crystallinity is required.

Among such SOI substrate production methods, the method of forming a non-single-crystal semiconductor layer on a porous layer and transferring the layer onto a supporting substrate via an insulating layer as disclosed in Japanese Patent Application Laid-Open No. 5-21338 is very excellent due to the uniform thickness of the SOI layer, its capability of maintaining the crystal-defect density of the SOI layer at a low level easily, the flatness of the surface of the SOI layer, no need for an expensive apparatus of a special specification for fabrication, and the capability of using the same apparatus for various SOI film thicknesses ranging from about several 100 Angstrom to 10 micron.

Furthermore, by combining the above method with the method disclosed in Japanese Patent Application Laid-Open No. 7-302889, that is, by forming a nonporous single crystal semiconductor layer on a porous layer formed on a first substrate, bonding the nonporous single crystal layer onto a second substrate via an insulating layer, separating the first substrate and the second substrate by the porous layer without destruction, and smoothing the surface of the first substrate and forming porous layer again for reuse, the first substrate can be used many times. This method can significantly reduce production costs and simplify the production steps.

There are several methods for separating the bonded substrates mutually to divide into the first substrate and the second substrate without destruction. For example, one of them is to pull the substrate in a direction vertical to the bonded surface. Another method is to apply a shearing stress in parallel with the bonded surface (for example, moving the substrates in the opposite directions within planes in parallel with the bonded surface or rotating the substrates in the circumferentially opposite directions). A pressure can be applied to the bonded surface in the vertical direction. Furthermore, a wave energy such as ultrasonic waves can be applied to the separation region. A peeling member (for example, a sharp blade such as a knife) can also be inserted into the separation region in parallel with the bonded surface from the side of the bonded substrates. Furthermore, the expansion energy of a material infiltrated into the porous layer that functions as the separation region may be used. The porous layer functioning as the separation region may also be thermally oxidized from the side of the bonded substrates to expand the volume of this layer. The porous layer functioning as the separation region may also be selectively etched from the side of the bonded substrates to separate the substrates. Finally, a layer formed by ion implantation to provide microcavities may be used as the separation region and the substrates may then be irradiated with laser beams from the normal direction of the bonded surface to heat the separation region containing the microcavity for separation.

However, these methods for separating the two bonded substrates mutually are ideally excellent, but all of them are not suitable for the production of semiconductor substrates. One of the difficulties is that the bonded semiconductor substrates are generally shaped like discs and have a small thickness, for example, 0.5 to 1.0 mm and that the bonded portion has few relatively large recesses on which a jig can be caught. Thus, a method of catching on an orientation flat portion of each substrate a jig having a recessed portion that fits the orientation flat portion and rotating the substrates in parallel with the bonded surface, or a method of catching the jig on a small recessed portion made in the bonded portion in the side of the bonded substrates to peel them are limited. The pressure-based separation requires a very large pressure, thereby forcing the size of the apparatus to be increased. In the wave energy method, the wave irradiation method must be substantially improved to irradiate the bonded substrates with wave energy efficiently, and immediately after separation, the separated substrates may partly contact and damage each other. In the separation from the side, the substrates may be bent to allow only their sides to be peeled, with their central portions remaining unseparated. In the method of inserting the peeling member into the separation region from the side of the bonded substrates, the insertion of the peeling member may damage the bonded surface between the substrates due to the friction of the peeling member and the substrates.

One solution for avoiding these problems is to reduce the mechanical strength of the separation region appropriately. This method, however, may increase the possibility that the separation region is destroyed by a n external impact prior to the bonding of the substrates. In such a case, part of the destroyed separation region may become particles and contaminate the inside of the production apparatus. Although the conventional separation methods have the major advantages, they still have the above problems.

SUMMARY OF THE INVENTION

It is an object of this invention to provide an improved separation method and apparatus that can separate the bonded substrates mutually without destruction to prevent the separated substrates from being damaged and that is unlikely to destroy the separation region prior to the step of separating bonded substrates even when an external force is applied thereto, thereby preventing the production apparatus from being contaminated with particles.

The feature of this invention resides in that a composite member having a plurality of members as mutually bonded is separated into a plurality of members at positions different from the bonded position (separation region) of the plurality of members by jetting a fluid against the composite member.

With respect to the separation method, the composite member may be any member having a separation region inside, whereas with respect to the semiconductor substrate production method, it must have the following structure. A major example of the composite member is bonded substrates by bonding a first substrate and a second substrate, the first substrate being a semiconductor substrate in which a separation region is formed as a layer in a portion located deeper than its surface and in parallel therewith and in which the surface and the portion shallower than it has no separation region. That is, when this invention is applied to the semiconductor substrate production method, the members obtained after separation are not the same as the first and second substrates prior to bonding.

According to this invention, the separation region is located at a position different from the bonding interface (junction surface) between the first and second substrates. In the separation step, the substrates must be separated by the separation region located at the position different from the bonding interface.

Thus, the separation region is adapted to be mechanically weaker than the bonding interface so that the separation region is destroyed before the bonding interface. Thus, when the separation region is destroyed, a portion of the surface side of the first substrate which has a predetermined thickness is separated from the first substrate while remaining bonded on the second substrate, thereby transferring the portion to the second substrate. The separation region may be a porous layer formed by the anodization method or a layer formed by ion implantation to provide microcavities. These layers have a large amount of microcavities. This region may also be a heteroepitaxial layer in which distortion and defects are concentrated in crystal lattices.

The separation region may also be multiple layers of different structures. For example, it may consist of multiple porous layers having different porosities or a porous layer of a porosity changing in the direction perpendicular to the layers, as required.

The layer transferred from the first substrate to the second substrate by, for example, separating the composite member comprising the first and second substrates bonded together with each other via the insulating layer is used as a semiconductor layer (an SOI layer) on the insulating layer to fabricate a semiconductor device.

Jet of a fluid that can be used for the separation can be conducted by a so-called water jet method that injects a flow of high-pressure water through a nozzle. Instead of water, this fluid may be an organic solvent such as alcohol, an acid such as hydrofluoric or nitric acid, an alkali such as potassium hydroxide, or a liquid capable of selectively etching the separation region. A fluid consisting essentially of an abrasive particle-free liquid is preferable. Furthermore, a fluid consisting of a gas such as air, a nitrogen gas, carbon dioxide, or a rare gas may be used. A fluid consisting of a gas or plasma that can etch the separation region may also be used.

The above separation method can be applied to the semiconductor substrate production method to enable the following methods:

1) A semiconductor substrate production method comprising the steps of preparing a first substrate comprising a porous single crystal semiconductor layer and a nonporous single crystal semiconductor layer sequentially stacked on a substrate; bonding the first substrate and a second substrate so as to provide a composite member having the nonporous single crystal semiconductor layer located inside; and jetting a fluid to the vicinity of the porous single crystal semiconductor layer in the composite member to separate the composite member at the porous single crystal semiconductor layer, or 2) a semiconductor substrate production method comprising the steps of implanting ions into a first substrate of a single crystal semiconductor at a predetermined depth to form an ion-implanted layer that can provide a microcavity layer; bonding the first substrate and a second substrate via an insulating layer so as to provide a composite member in which the ion-implanted surface of the first substrate is located inside; and jetting a fluid against the vicinity of the ion-implanted layer of the composite member to separate the composite member at the ion-implanted layer. This invention thus provides the semiconductor substrate production method that can solve the conventional problems.

BRIEF DESCRIPTION OF THE DRAWINGS

FIGS. 2A and 2B are schematic views illustrating an example of a method for separating the composite member using a fluid according to this invention;

DETAILED DESCRIPTION OF THE PREFERRED EMBODIMENTS

Figure 1A:
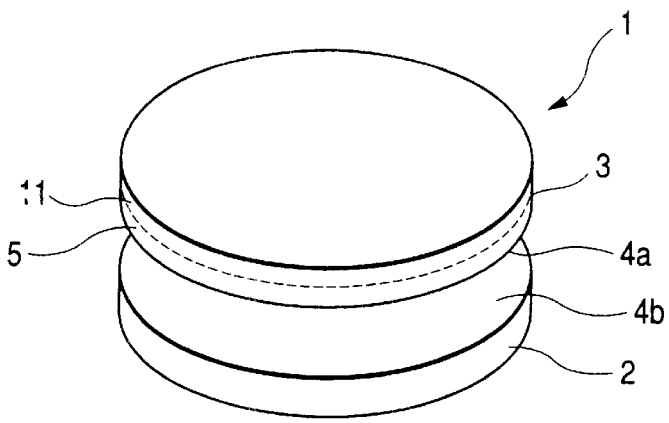
FIGS. 1A, 1B and 1C are schematic views illustrating a method for separating a composite member according to this invention.
Figure 1B:
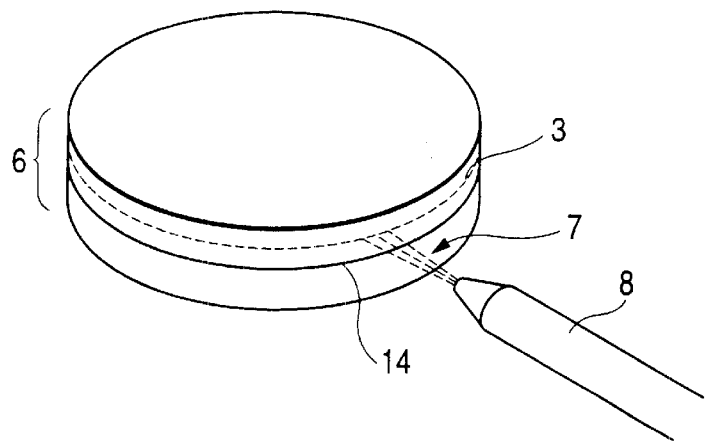
Figure 1C:
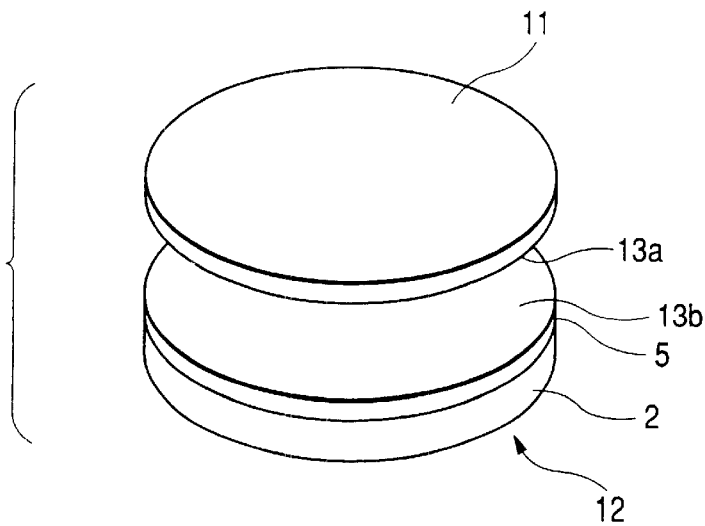

FIGS. 1A to 1C are schematic views illustrating a method of separating a composite member according to this invention.

FIG. 1A shows a state prior to the bonding of a first member 1 and a second member 2. The first member 1 has inside a separation region 3 which is a separation position of this member. The separation region 3 shaped like a layer has a lower mechanical strength than a layer region 5 located on the side of a bonding surface 4a.

The two members 1 and 2 are bonded such that the bonding surface 4a is faced to a bonding surface 4b in order to form a disc-like composite member having a bonding interface 14, as shown in FIG. 1B. A fluid 7 is jetted from a nozzle 8 toward the end of the separation region 3 located on the side (end surface) 6 of the composite member. The separation region 3 against which the fluid 7 is jetted is removed or collapsed. Thus, the composite member is separated into two members 11 and 12 at the separation region 3, as shown in FIG. 1C.

The layer region 5 is not present on a separation surface 13a of the separated member 11, and a layer region 5 has been transferred onto a bonding surface 4b of the original second member 2 so as to expose a separated surface 13b.

Thus, a member having the thin layer region 5 on the second member 2 is obtained.

By forming the second member 2 and layer region 5 by using different materials, a member having a heterogeneous bonding can be produced easily. Specific examples of such materials include conductors, semiconductors, and insulators, and two of which are selected to form the second member 2 and the layer region 5.

In particular, silicon, quartz, glass, or silicon having an insulating film formed on its surface is preferably used as the second member.

A semiconductor material such as silicon, silicon germanium, silicon carbide, gallium arsenide, or indium phosphorus is preferably used as the layer region. The layer region of such a material may partially include an thin insulating layer.

The most preferred composite member that is separated into at least two is obtained by bonding two semiconductor substrates, or one semiconductor substrate and one insulating substrate and is called bonded substrates or bonded wafers.

Separating such a composite member provides a semiconductor substrate of an excellent SOI structure.

Prior to bonding, the separation region is desirably formed inside a substrate along the bonding surface.

The separation region may be fragile enough to allow the composite member to be separated into two at the separation region by the jetted fluid and to prevent damage to other regions other than the separation region.

Specifically, it can be made fragile by containing a plurality of microcavities inside the separation region or implanting heterogeneous ions to cause strain.

The microcavity is formed of pores of a porous body or bubbles generated by ion implantation, as described below. The separation region is preferably 0.1 to 900 $\mu$m and more preferably 0.1 to 10 $\mu$m.

The flow of a fluid used to execute separation according to this invention can be implemented by jetting the fluid through a nozzle. A method for converting the injected flow into thin beams at a high speed and a high pressure may be the water jet method using water as the fluid such as that introduced in "Water Jet" Vol. 1, No. 1, p. 4. In the water jet that can be used for this invention, high-pressure water at several-thousand kgf/cm$^2$ pressurized by a high-pressure pump is jetted through a thin nozzle and can cut or process ceramics, metal, concrete, resin, rubber, or wood (an abrasive material such as $SiO_2$ grains is added to water if the material is hard), remove a paint film from a surface layer, or wash the surface of a member. The water jet has been mainly used to remove a part of the material, as described above. That is, water jet cutting has been carried out to remove a cut edge from a main member, and the removal of the paint film and the washing of the member surface has been executed to remove unwanted portions. If the water jet is used to form the flow of a fluid according to this invention, it can be jetted toward the bonding interface on the side (end surface) of bonded substrates to remove at least a part of the separation region from the side. In this case, the water jet is jetted against the separation region exposed on the side of the bonded substrates and against a part of the first and second substrates in the vicinity of the separation region. Then, the separation region of a low mechanical strength is removed or destroyed by the water jet to separate the composite member into two substrates without damage to each substrate. Even if the separation region is not exposed on the side but is instead covered with a certain thin layer for any reason, the water jet may be used to remove the layer covering the separation region on the side and then to remove the separation region exposed from the side.

Although not often used in the prior art, the water jet may be jetted against a small recessed portion on the side of two bonded chamfered substrates, that is, on their circumference to penetrate and extend microcavities or pores in the separation region of a fragile structure to separate the bonded substrates. This operation is not intended to perform for cutting or removal, so little chips occur from the separation region and the composite member can be separated without the need for abrasive particles or damage to surfaces obtained by separation, even if the material of the separation region cannot be removed by the water jet. This is not a cutting or polishing effect but a kind of wedge effect provided by the fluid. Thus, this is very effective if there is a recessed or narrow gap on the side of the bonded substrates and the jetting force of the water jet is applied in a direction in which the substrates are peeled off at the separation region. To obtain a sufficient effect, the side of the bonded substrates is preferably recessed rather than protruding.

FIGS. 2A and 2B show this effect. In FIGS. 2A and 2B, 901 and 911 indicate first substrates, 902 and 912 second substrates, 903 and 913 separation regions, 904 and 914 semiconductor layers, 905 and 915 insulating layers, 906 and 916 bonding interfaces, 907 a jet of a fluid, and 908 and 918 the directions of forces applied to the substrates by the fluid.

FIG. 2A conceptually shows the direction of a force applied to the substrates by the water jet when the side of the end of the bonded substrates is recessed. The force is applied in a direction in which the recessed portion is extended, that is, in a direction in which the bonded substrates are peeled off. On the contrary, FIG. 2B conceptually shows the direction of a force applied to the substrates by the water jet when the side of the end of the bonded substrates is protruding. In this case, a force is not applied in the direction in which the bonded substrates are peeled off, so the substrates cannot be separated mutually unless a part of the separation region can be initially removed.

Even if the separation region is not exposed on the side but is instead covered with a certain thin layer for any reason, a sufficient separation effect can be obtained when the side of the bonded substrates is recessed as described above because a force is applied in the direction in which the vicinity of the separation region is extended to destroy the thin layer covering the separation region on the side and then to extend and destroy the separation region. To efficiently receive the flow of the water jet, the aperture width of the recessed portion is desirably equal to or larger than the diameter of the water jet. When this invention is applied to manufacture a semiconductor substrate, since the thickness of the first and second substrates is less than 1.0 mm, the thickness of the bonded substrates, that is, of the composite member is less than 2.0 mm. Since the aperture width of the recessed portion is normally about half this value, the diameter of the water jet is preferably 1.0 mm or less. Actually, a water jet of about 0.1 mm diameter can be put to practical use.

The nozzle jetting the fluid may have any shape including a circle. A long slit-like nozzle can also be used. By jetting the fluid through such a nozzle, thin band-like flows can be formed.

Various jet conditions of the water jet can be selected arbitrarily depending on the type of the separation region or the shape of the side of the bonded substrates. For example, the pressure of the jet and its scanning speed, the diameter of the nozzle (≈the diameter of the water jet) and its shape, the distance between the nozzle and the separation region, and the flow rate of the fluid are important parameters.

In an actual separation step, separation can be achieved by scanning the nozzle along the bonded surface while jetting the water jet from a direction in parallel with the bonding surface or fixing the water jet while moving the bonded substrates in parallel. In addition, the water jet may be scanned so as to draw a fan around the nozzle, or the bonded substrates may be rotated around the position of the fixed nozzle as a rotational center if, as is often the case, the bonded substrates are shaped like discs such as wafers with orientation flats or notches. Furthermore, the water jet may be jetted against the separation region from an angled direction as required instead of placing the nozzle in the same plane as the bonded interface. The scanning of the water jet is not limited to these methods but may be carried out by any other method as required. Since the water jet has a very small diameter and the injection direction is almost parallel with the surface of the substrate, vector resolution shows that a high pressure of several-thousand kgf/cm² is rarely applied to the substrates. Since the water jet applies a force of only several hundred grams to the bonded substrates except for the separation region, the substrates are prevented from being destroyed.

Instead of water, an organic solvent such as alcohol, acid such as hydrofluoric or nitric acid, or alkali such as potassium hydroxide, or a liquid that can selectively etch the separation region may be used. Furthermore, a gas such as air, nitrogen gas, carbon dioxide gas, or rare gas may be used as fluid. A gas or plasma that can etch the separation region may also be used. As water to be used for a composite member separation method introduced into the process of producing a semiconductor substrate, pure water with a minimized amount of an impurity metal and particles, and ultrapure water are desirably used, but the substrates may be washed and the impurity metal and particles are removed after separation using the water jet, due to the perfect low-temperature process. In particular, in this invention, the fluid is preferably free of abrasive particles so as not to leave unwanted scratches in the substrates.

A semiconductor substrate according to this invention can be used to fabricate a semiconductor device and to form a single crystal semiconductor layer on the insulating layer into a fine structure instead of an electronic device.

Figure 3:
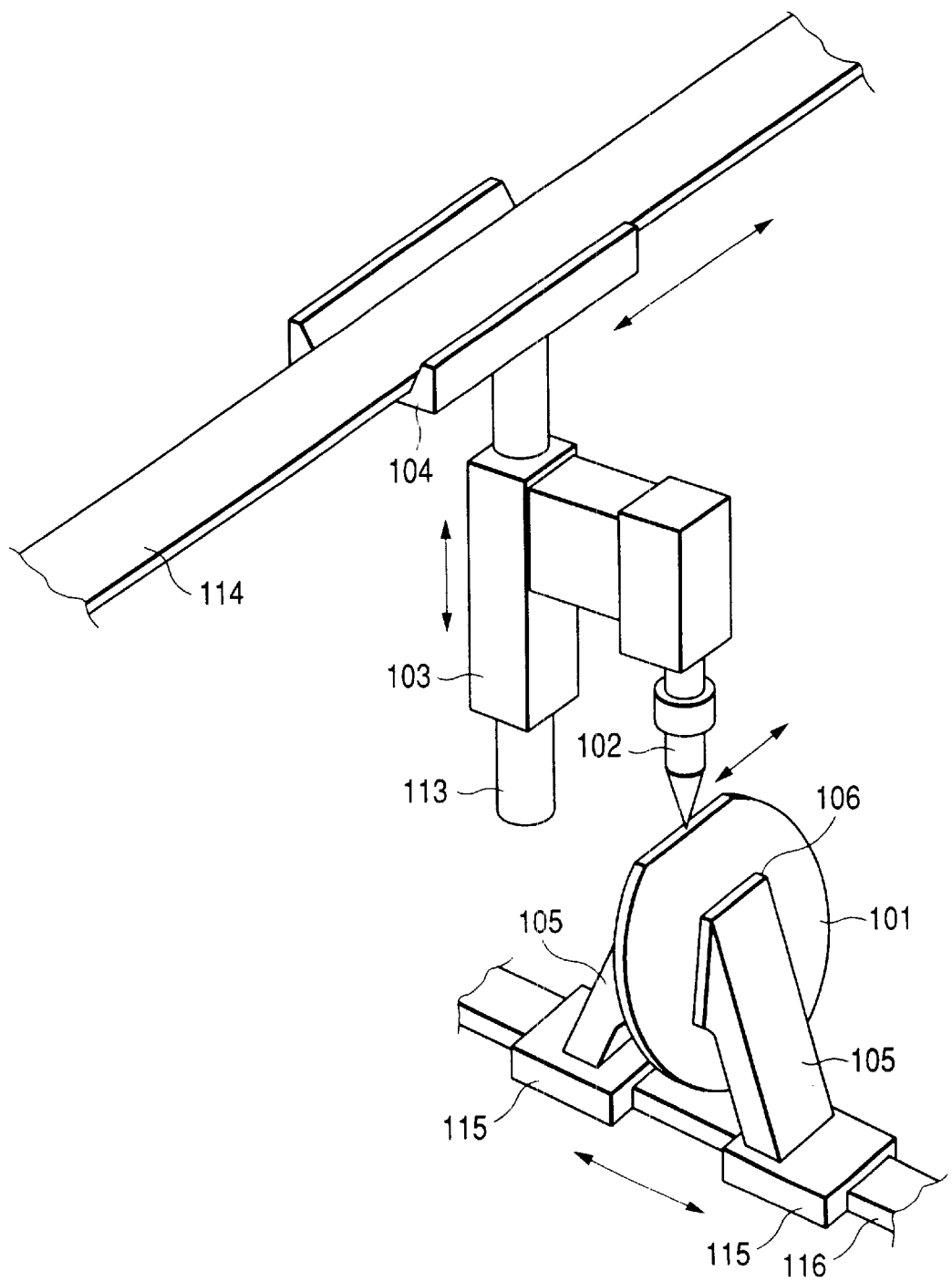
FIG. 3 is a perspective view showing an example of a separation apparatus according to this invention.

FIG. 3 is a schematic view showing a separation apparatus according to one embodiment of this invention.

Reference numeral 101 denotes bonded wafers as a composite member; 102 a fluid jet nozzle; 103 a vertical movement mechanism for adjusting the vertical position of the nozzle 102; 104 a horizontal movement mechanism for adjusting the horizontal position of the nozzle 102; 115 a horizontal movement mechanism for adjusting the horizontal position of the wafer; and 105 a wafer holder as a holder.

Reference numerals 113, 114, and 116 denote guides.

In the apparatus shown in FIG. 3, the wafer separation operation is performed by using the movement mechanisms 103, 104, and 115 to align the nozzle 102 with the end of the separation region of the wafer 101 and jetting a highly pressurized fluid from the nozzle 102 to the end of the separation region on the side of the wafer 101 while moving the nozzle in the horizontal and vertical directions with the wafer 101 remaining fixed.

Reference numeral 106 indicates a backing material used as required and consisting of a porous or nonporous elastic body.

Figure 4:
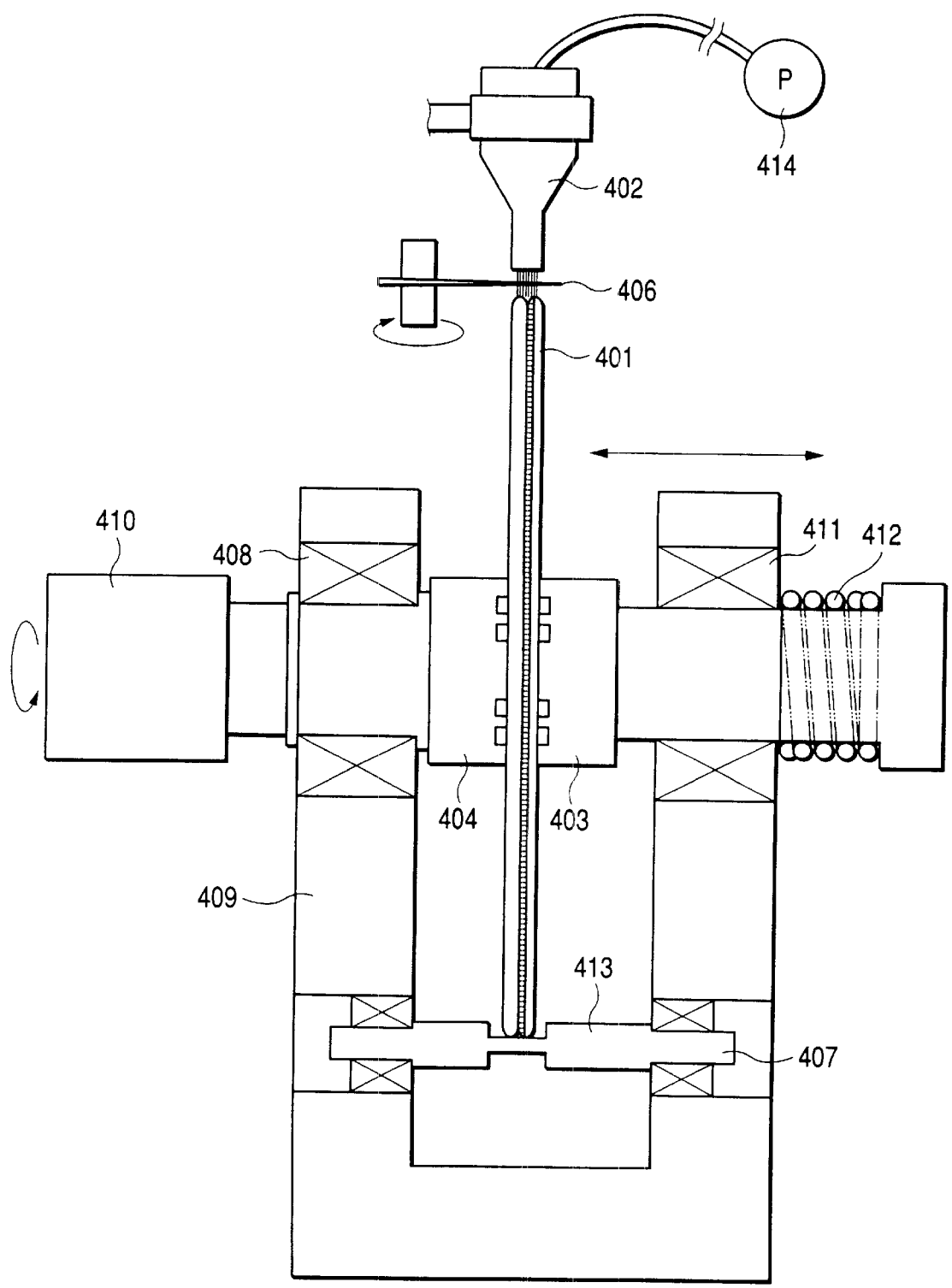
FIG. 4 is a sectional view showing another example of a separation apparatus according to this invention.

FIG. 4 is a schematic perspective view showing another example of a separation apparatus used for this invention. In FIG. 4, 401 indicates two semiconductor wafers of Si integrally bonded as a composite member having inside a porous layer that acts as a separation region. Reference numerals 403 and 404 indicate holders that suck and fix the semiconductor wafer 401 using a vacuum chuck and that are rotatably mounted on the same rotating shaft. The holder 404 is fitted in a bearing 408 and supported by a supporting stand 409, and its rear end is directly coupled to a rotating shaft of a speed control motor 410. Thus, controlling the motor 410 enables the holder 404 to be rotated at any speed. The other holder 403 is fitted in a bearing 411 and supported by the supporting stand 409, and a compression spring 412 is provided between the rear end of the holder 403 and the supporting stand 409 to apply a force in a direction in which the holder 403 leaves the semiconductor wafer 401.

The semiconductor wafer 401 is set so as to correspond to a recessed portion of a positioning pin 413 and is sucked and held by the holder 404. The holder 404 can hold the middle of the semiconductor wafer 401 by using the pin 413 to adjust the vertical position of the wafer 401. The holder 403 is moved leftward against the spring 412 to a position at which it sucks and holds the semiconductor wafer 401. In this case, a rightward force is applied to the holder 403 by the compression spring 412. The returning force applied by the compression spring 412 and the force of the holder 403 for sucking the semiconductor wafer 401 are balanced so that the force of the compression spring 412 will not cause the holder 403 to leave the wafer 401.

A fluid is fed from a jet pump 414 to the jet nozzle 402 and continues to be output until the jet fluid is stabilized. Once the flow of the fluid has been stabilized, the nozzle is moved, a shutter 406 is opened, and the fluid is jetted from the jet nozzle 402 to the side of the substrate 101 against the center of thickness of the semiconductor wafer 401. At this point, the holder 404 is rotated by the motor 410 to rotate the semiconductor wafer 401 and holder 403. By jetting the fluid against the vicinity of the thickness-wise center of the semiconductor wafer 401, the semiconductor wafer 401 is extended to cause a porous layer in the semiconductor wafer 401 that is relatively weak to be destroyed and is finally separated into two.

As described above, the fluid is applied to the semiconductor wafer 401 uniformly and a rightward force is applied to the holder 403 holding the semiconductor wafer 401, so that separated semiconductor wafers 401 are unlikely to slide after separation.

The bonded wafer 401 can also be separated by scanning the nozzle 402 in parallel with the bonding interface (surface) of the bonded wafer 401 without rotating the wafer 401. When, however, separation is executed by scanning the nozzle 402 without rotating the bonded wafer 401, high-pressure water at 2000 kgf/cm$^2$ is required for a nozzle diameter of 0.15 mm, whereas only 200 kgf/cm$^2$ of pressure is required when separation is carried out by rotating the bonded wafer 401 with the nozzle 402 fixed.

This is because water is jetted to the center of the bonded wafer 401 to enable the water pressure to act efficiently as an extending force compared with the scanning of the nozzle.

The following effects can be obtained by reducing the water pressure.

1) The wafer can be separated without destruction.
2) A large number of jets can be simultaneously used due to the increased available capacity of the pump.
3) The size and weight of the pump can be reduced.
4) A wider range of materials are available for the pump and piping to allow the apparatus to easily utilize pure water.
5) The sound of the pump and, in particular, of the jet is reduced to allow sound-proof measures to be taken easily.

The wafer holding means shown in FIG. 4 holds the wafer by using the holders 403 and 404 to pull the wafer from both sides, but the wafer may also be held by pressing it from both sides of the holders 403 and 404. In this case, the high-pressure water also advances while extending the bonded wafer 401 to form a small gap in them, and finally separates them into two.

The smaller the contact portion between the holders 403 and 404 and the bonded wafer 401 is, the more flexibly the bonded wafer 401 can move when the high-pressure water extends the wafer 401. Stress concentration caused by the excessively high pressure and the presence of water in the separation interface of the bonded wafer 401 serve to prevent cracks and to allow the wafer to be extended easily. These points enable effective separation. For example, when the contact portion between the holders 403 and 404 and the bonded wafer 401 has a diameter of 30 mm or less, the bonded wafer 401 does not crack and can be separated into two during a single rotation of the bonded wafer 401, under the conditions of the nozzle having a diameter of 0.2 mm and the pressure of 400 kgf/cm$^2$.

In addition, the larger the contact portion between the holders 403 and 404 and the bonded wafer 401 is, the more firmly the rear surface of the bonded wafer 401 is supported when the high-pressure water extends the wafer 401, thereby preventing cracks during separation. When the contact portion between the holders 403 and 404 and the bonded wafer 401 has a diameter of 100 mm or more, the bonded wafer 401 can be separated into two without cracks under the conditions of the nozzle having a diameter of 0.2 mm and the pressure of 400 kgf/cm$^2$.

If foreign matters such as particles are sandwiched between the holder 403 or 404 and the bonded wafer 401, the bonded wafer 401 is no longer held in the vertical direction to cause the nozzle 402 to be offset from its perpendicular direction toward the top of the bonded wafer 401 to the longitudinal or lateral direction, thereby failing to effectively hit the high-pressure fluid against the separation interface in the wafer 401. To prevent this, the surfaces of the holders 403 and 404 that contact the bonded wafer 401 can be formed with a large number of fine protrusions to minimize the contact area in order to reduce the effect of possible sandwiched foreign matters.

In the supporting apparatus shown in FIG. 4, the holder 404 is rotated to rotate the holder 403 with it, so that a slight force is effected in the direction in which the rotation is stopped and torsion may occur in the separation surface until the bonded wafer 401 is entirely separated. In this case, the holders 403 and 404 can be rotated synchronously to prevent torsion in the separation surface. This method is described below in detail.

Figure 5:
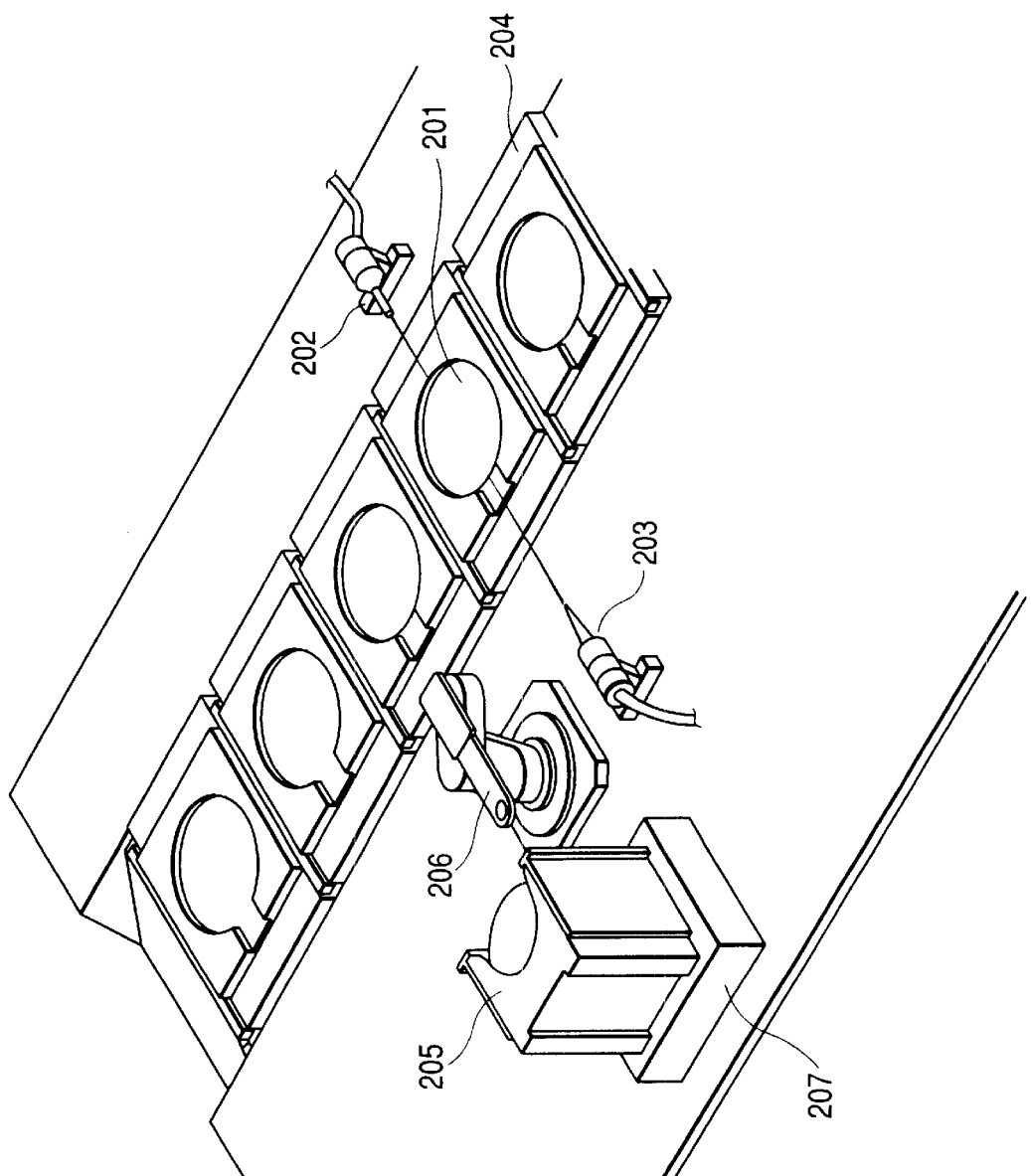
FIG. 5 is a perspective view showing yet another example of a separation apparatus according to this invention.

FIG. 5 shows another separation apparatus according to this invention. In this figure, numeral 204 indicates a wafer horizontal-drive mechanism, 205 a wafer carrier, and 206 a wafer transfer arm. As shown in this figure, the wafer cassette 205 is placed on a cassette stand 207 such that a wafer 201 is arranged in the horizontal direction. The wafer 201 is loaded on a wafer supporting stand 204 using a wafer loading robot 206. The wafer supporting stand 204 on which the wafer 201 is loaded is transferred to the position of high-pressure jet nozzles 202 and 203 by a supporting stand movement mechanism such as a belt conveyor. A high-pressure fluid is jetted against a separation region in a recessed potion in the wafer formed by bevelling, through the nozzles 202 and 203 of a fluid jet apparatus located on the side of the wafer, from a direction parallel with the bonded interface (surface) in the bonded wafer. In this case, the nozzles are fixed and the bonded wafer is scanned in the horizontal direction to receive the high-pressure fluid along the recessed portion formed by bevelling. One or both of the nozzles 202 and 203 may be used as required.

This operation enables the wafer to be divided into two at a porous Si layer. Although not shown in the drawing, another loading robot stores the separated wafers as a first and a second substrates.

In the horizontal jet method, the wafer need not be fixed and, after separation, is unlikely to jump out from the wafer supporting stand 204 due to its own weight. Alternatively, after the wafer has been loaded on the wafer supporting stand, a jump prevention pin may be installed on the top of the wafer so as to protrude from the wafer supporting stand 204 to over the wafer or the top of the wafer may be pressed softly.

Furthermore, a plurality of bonded wafers may be placed and set in the vertical direction relative to their surfaces, and one separation region of the bonded wafers may then be separated through horizontal scanning. A wafer set jig may subsequently be moved in the vertical direction over a distance equal to the wafer interval to allow the second separation region of the bonded wafer to be separated sequentially through horizontal scanning similarly to the first separation of the bonded wafers.

Figure 6:
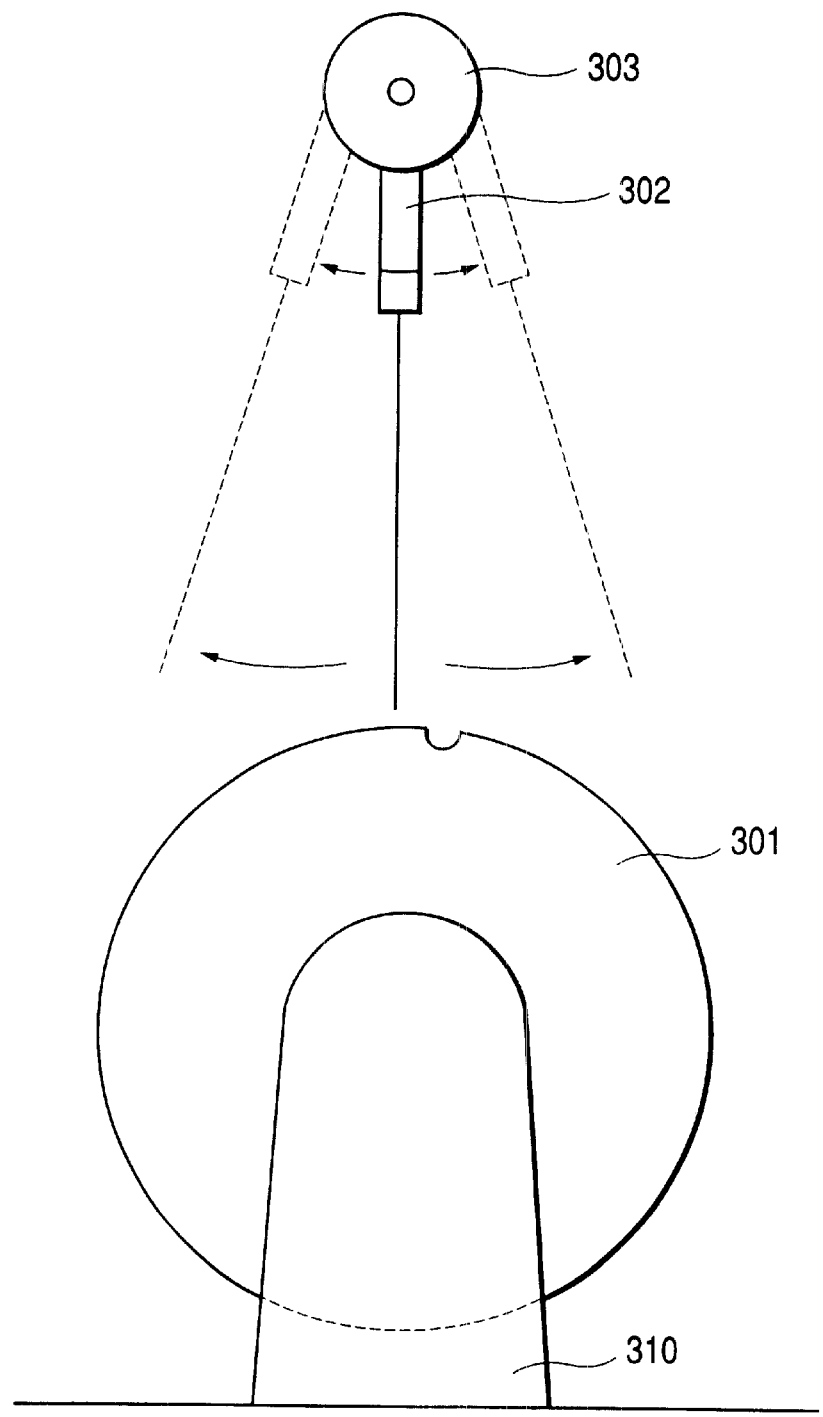
FIG. 6 is a schematic view showing still another example of a separation apparatus according to this invention.

FIG. 6 schematically shows another separation apparatus according to this invention. This figure conceptually shows a nozzle of a water jet apparatus used in this embodiment and its movement. As shown in FIG. 6, a bonded wafer 301 is held by a holder 310 so as to stand in the vertical direction. A high-pressure fluid is jetted against a recessed potion of the wafer formed by bevelling, through the nozzle 302 of the jet apparatus located above the wafer, from a direction parallel with the bonding interface (surface) of the bonded wafer. In this case, the nozzle 302 and a supporting point 303 that allows the nozzle to oscillate within a plane so as to draw a fan are placed in the same plane as the bonded surface in the wafer. The nozzle is oscillated within the bonded surface in the wafer to oscillate the flow of the jet within this surface. This operation enables the high-pressure jet to be moved and jetted along the recessed portion or gap in the bonding portion in the edge of the bonded wafer. This in turn enables the fluid to be jetted against a wide separation region without the need for a robot that moves the nozzle within the bonding surface accurately or a more mechanically complicated mechanism for moving or rotating the bonded wafer.

Figure 7:
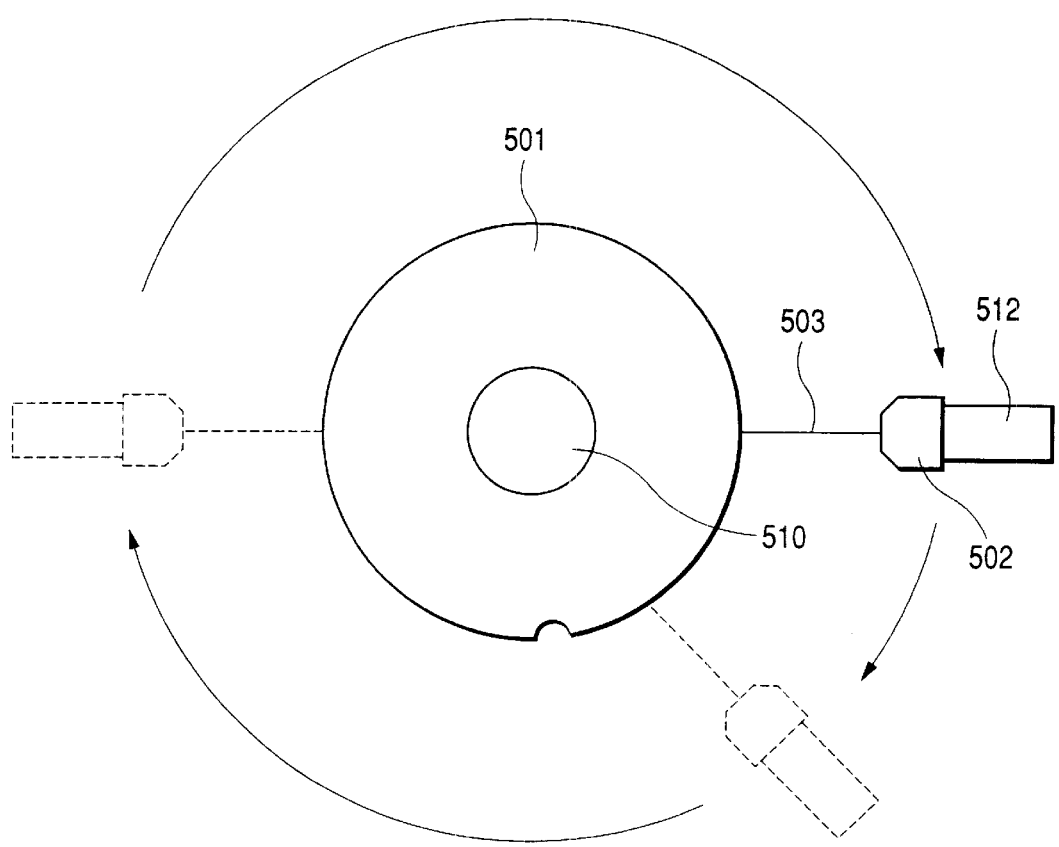
FIG. 7 is a schematic view showing still another example of a separation apparatus according to this invention.

FIG. 7 conceptually shows another separation apparatus according to this invention, that is, another method for jetting a jet 503 against the periphery of a bonded wafer 501. The bonded wafer 501 is fixed by a holder 510 and a nozzle 502 can be rotated around the wafer to allow the jet 503 to be jetted against the bonding portion all over the edge of the wafer. The center of the wafer is held and a rail (not shown in the drawing) concentric with the wafer is installed around the wafer 501, and a jig 512 with the nozzle 502 fixed thereto can be slid on the rail to allow the jet 503 to be jetted against the bonding portion from around the wafer 501.

Figure 8:
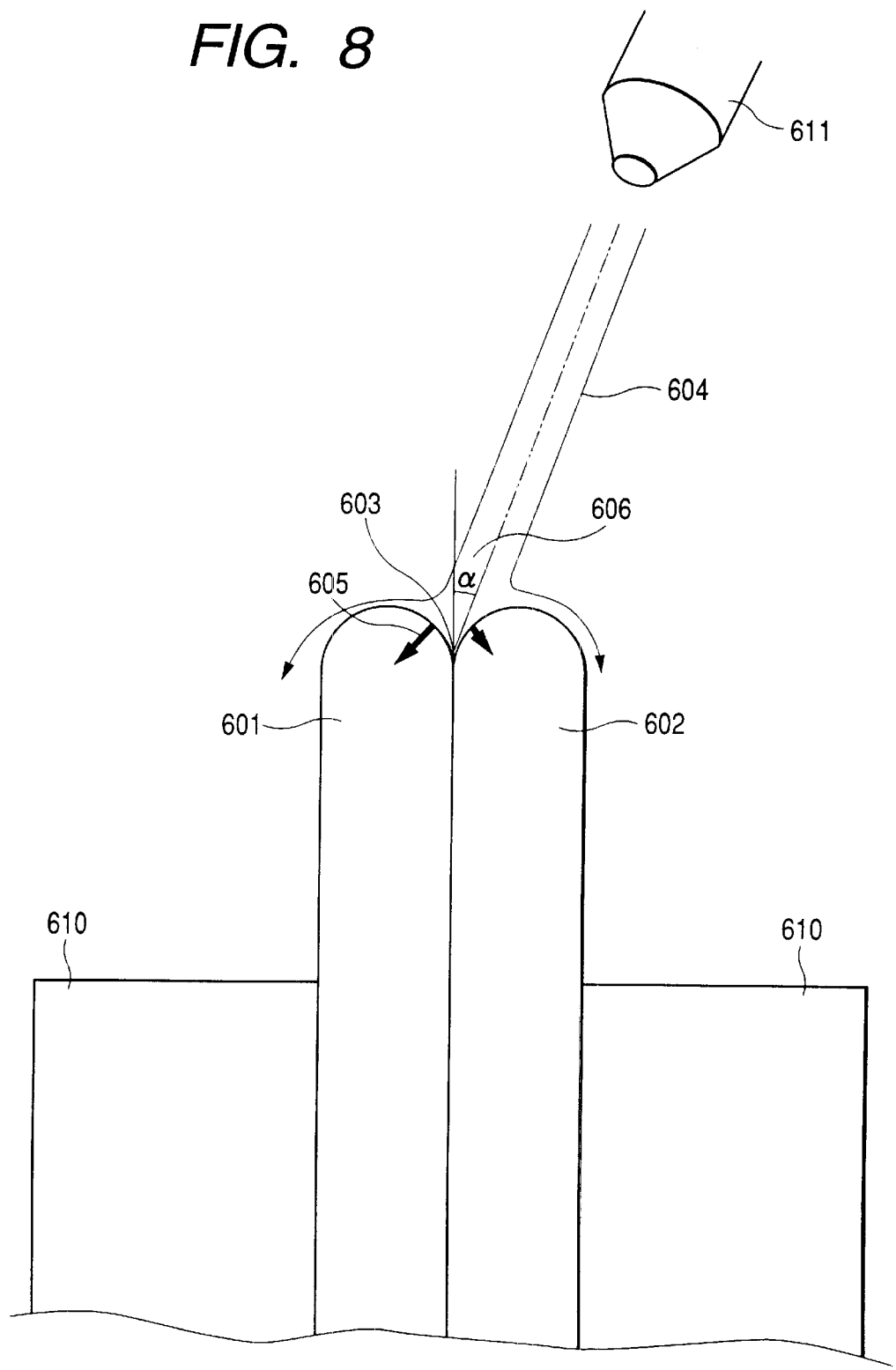
FIG. 8 is a schematic view illustrating another example of a method for separating a composite member using a fluid according to this invention.

FIG. 8 shows another example of a separation apparatus according to this invention. In this figure, 601 is a first wafer, 602 is a second wafer, 603 is a bonding surface, 604 is a fluid jet, 605 is a direction of a force applied to the wafer by the fluid jet, and reference numeral 606 indicates an angle between the fluid jet and the bonding surface. According to this embodiment, the positions of the nozzle 611 and holder 610 are set so that the direction of the jet jetted from the nozzle 611 is inclined at an angle α from a direction parallel with the separation surface in the wafer.

The wafer can be held by the apparatus shown in FIG. 4 and the nozzle can be disposed as shown in FIG. 8 to jet the fluid against the side of the wafer. Since the jet 604 is inclined at an angle α (606) from the bonding surface 603, different pressures are applied to the two wafers 601 and 602. In the example shown in FIG. 8, a relatively small force is applied to the wafer 602 toward which the jet is inclined, whereas a larger force is applied to the opposite wafer 601. When the jet is inclined at a side opposite to the wafer in which porous Si is formed, porous Si or a microcavity layer can be destroyed easily. Thus, the bonded wafers are desirably installed such that the wafer 601 contains porous Si.

Figure 9:
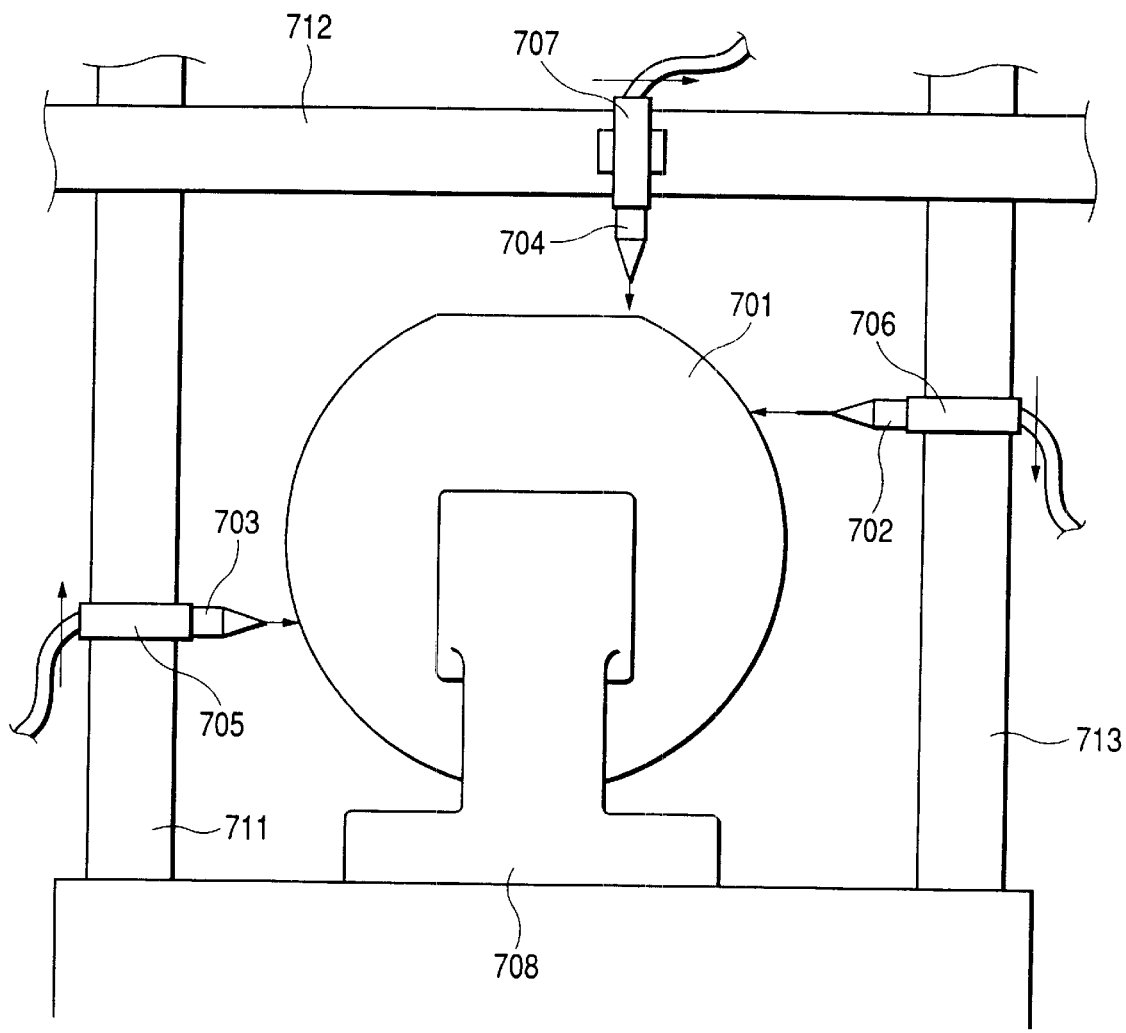
FIG. 9 is a schematic view showing another example of a separation apparatus according to this invention.

FIG. 9 shows another separation apparatus according to this invention. In this figure, 705 and 706 are vertical drive mechanisms for fluid jet apparatus nozzles 702 and 703, 707 is a horizontal drive mechanism for a water jet apparatus nozzle 704, and 708 is a wafer holder.

A shown in FIG. 9, the wafer holder 708 is used to hold both sides of the bonded wafer 701 so as to stand in the vertical direction. In this case, a side of the wafer having an orientation flat portion is directed upward. A high-pressure fluid is jetted against a recessed potion or gap in the wafer 701 formed by bevelling, through the nozzles 702, 703, and 704 of the plurality of (in this example, three) jet apparatuses located above or on the side of the wafer, from a direction parallel with the bonding interface (surface) in the bonded wafer. The configuration of each nozzle is the same as in FIG. 3. In this case, the plurality of nozzles 702, 703, and 704 are scanned along guides 711, 712, and 713 in a direction in which the high-pressure fluid moves along the gap formed by bevelling.

In this way, the bonded wafers are divided into two.

When only one nozzle is used, a high pressure is required that is sufficient to separate the wafer over a distance corresponding to its diameter. When the pressure is only sufficient to separate the wafer over a distance corresponding to its radius, the wafer must be turned upside down and separated again over a distance corresponding to its radius. The plurality of nozzles can be used to allow each nozzle to separate the wafer only over a distance corresponding to its radius, and the need to jet the high-pressure fluid against the wafer again after turning it upside down is omitted, and the overall surface of the wafer can be separated during a single step.

Figure 10A:
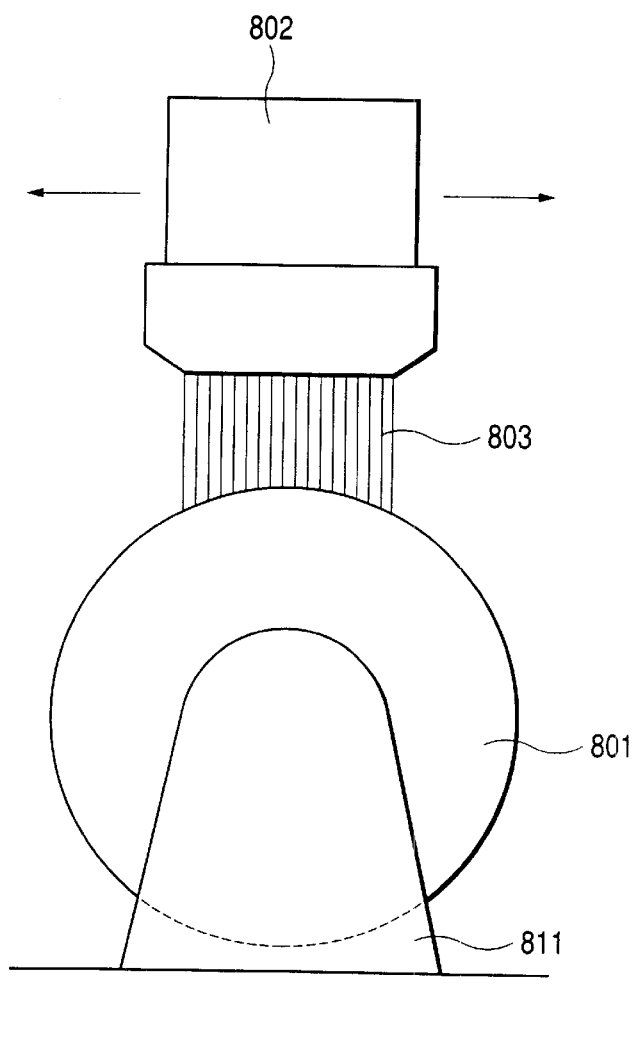
FIGS. 10A and 10B are schematic views showing yet another example of a separation apparatus according to this invention.
Figure 10B:
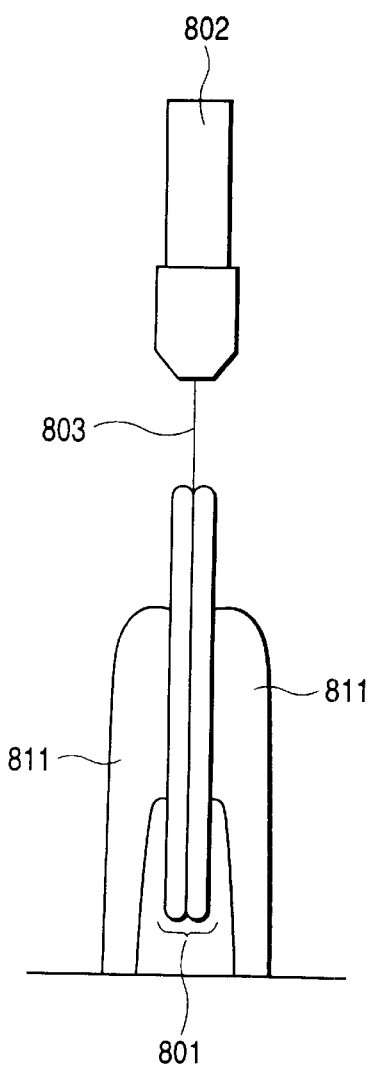

FIGS. 10A and 10B show another separation apparatus according to this invention. In this figure, 801 is bonded wafers as a composite member, 802 is a nozzle for a fluid jet, and 803 is a fluid. A high-pressure pure water is jetted against a gap in the wafer formed by bevelling, through the nozzle with slit-like openings of the jet apparatus located above or on the side of the wafer, from a direction parallel with the bonding interface (surface) in the bonded wafer while allowing the bonded wafer to stand perpendicularly to the holder 811, as shown in FIGS. 10A and 10B. The slit is located parallel with the bonding interface (surface) in the bonded wafer and positioned so that a linear flow of water is jetted accurately against the gap in the wafer formed by bevelling. A plurality of nozzles are scanned in a direction in which the high-pressure fluid moves along the gap formed by bevelling.

The need to scan the nozzle is omitted by increasing the length of the slit above the diameter of the wafer.

The effect of this slit-like nozzle is that the wafer can be divided under a lower pressure than with a single nozzle of a very small diameter. Despite the low pressure, by increasing the area from which the high-pressure fluid is jetted, the energy used to separate the wafer can be increased to enable it to be divided easily.

Figure 11:
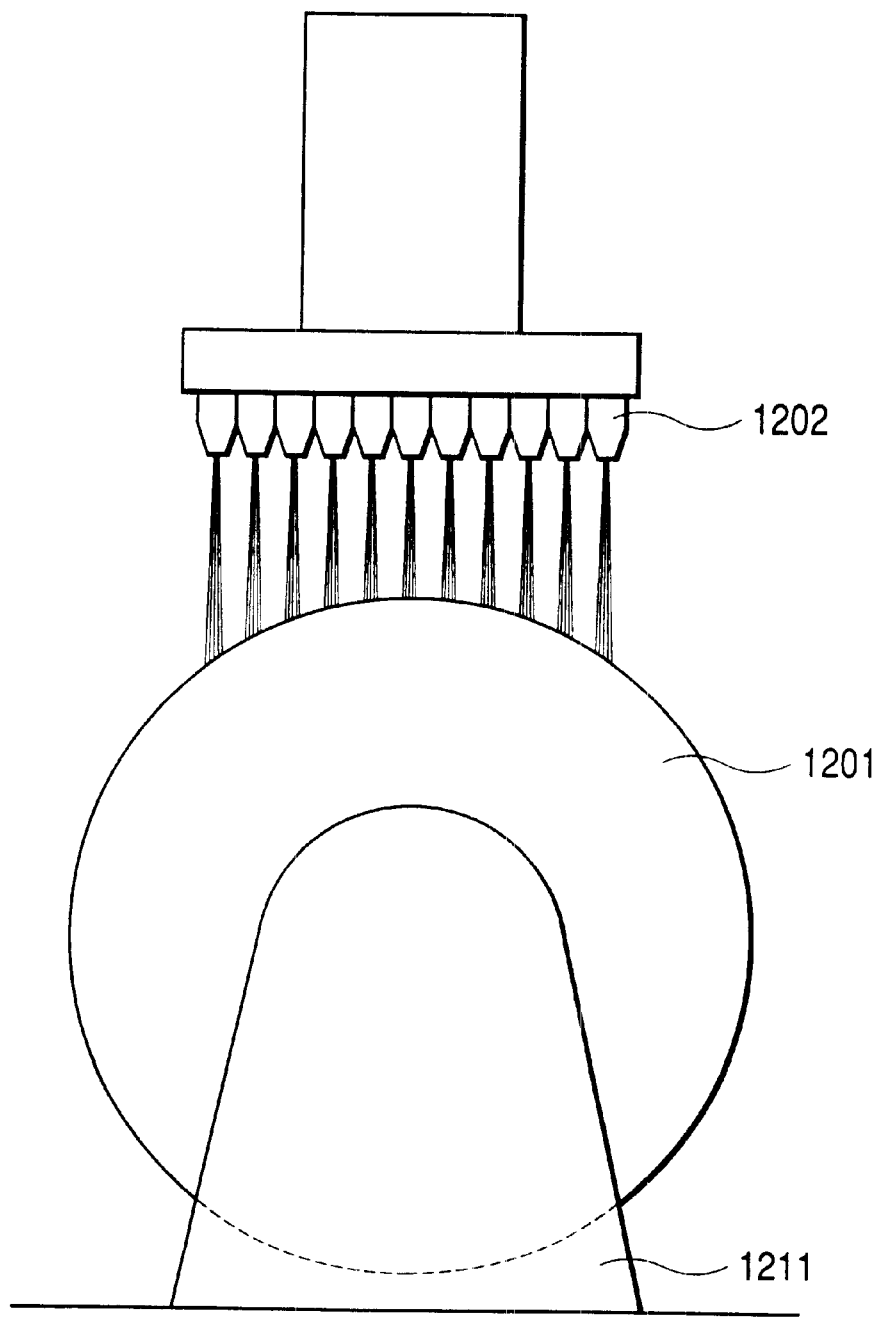
FIG. 11 is a schematic view showing still another example of a separation apparatus according to this invention.

Not only a nozzle having a slit-like opening but also a plurality of nozzles 1202 placed closely in a line to jet a fluid against a bonded wafer 1201 as shown in FIG. 11 can be used for this invention to obtain similar results. Reference numeral 1211 indicates a wafer holder.

Figure 12:
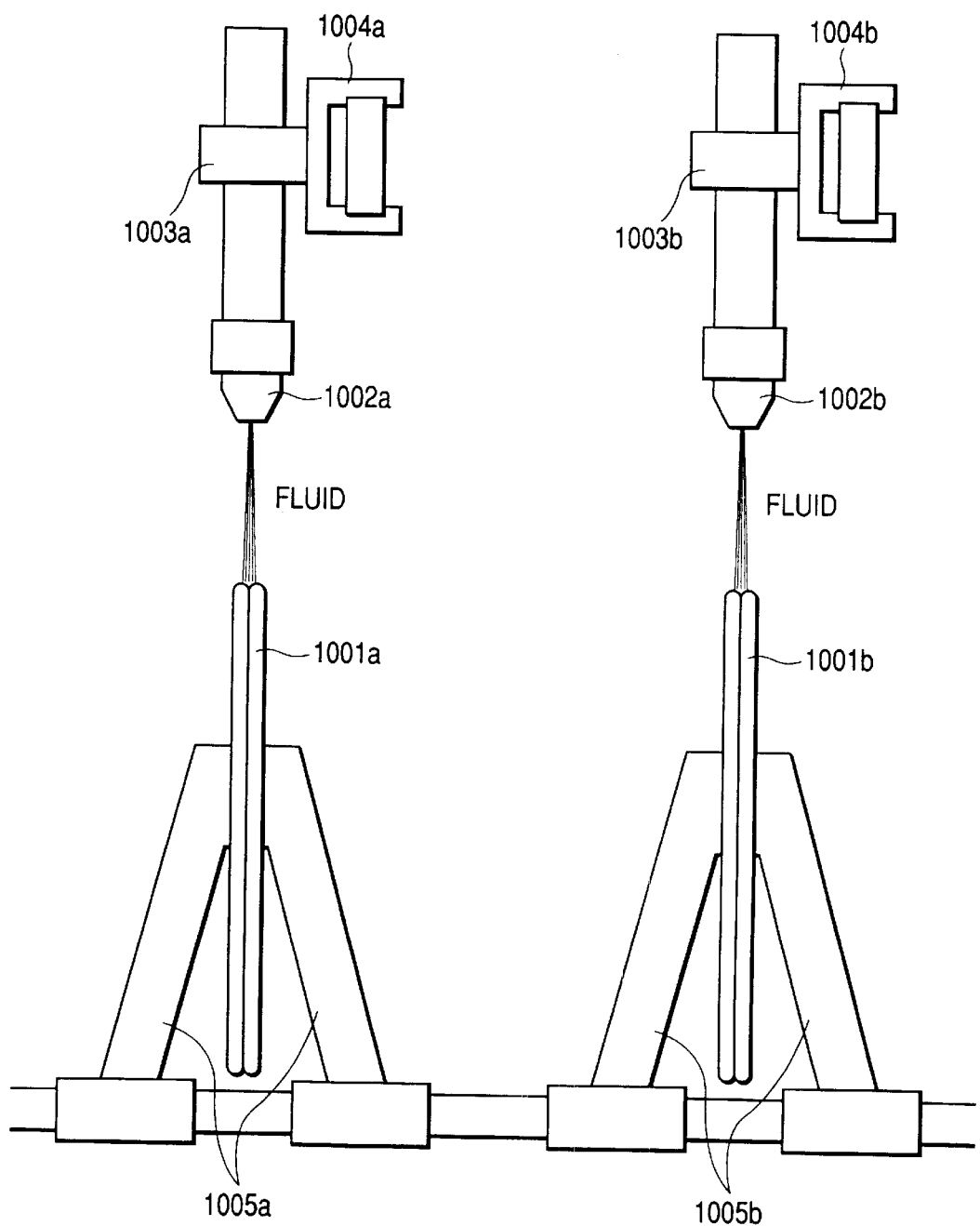
FIG. 12 is a schematic view showing still another example of a separation apparatus according to this invention.

FIG. 12 shows another separation apparatus according to this invention which can use a plurality of jets to separate a plurality of wafers at the same time. In a basic configuration of the apparatus in FIG. 12, components similar to those in FIG. 3 are installed independently. A wafer 1001a is set on a holder 1005a. A high-pressure fluid jetted from a nozzle 1002a hits against a bevelled portion of the wafer 1001a. The nozzle 1002a can be moved in a direction perpendicular to the sheet of the drawing by a horizontal-movement mechanism 1004a while jetting the high-pressure fluid against the bevelled portion. A similar operation can be performed by the apparatus in the right of the figure having a nozzle 1002b, a horizontal-movement mechanism 1004b, and a holder 1005b. This configuration doubles the throughput. Although this figure shows two sets of the jet apparatus, three or more of such apparatuses may be installed.

In addition, when the high-pressure pump does not have a large capacity, the right wafer can be changed while the left high-pressure fluid is being jetted, and vice versa. This requires only one set of a loader and an unloader robots.

Figure 13:
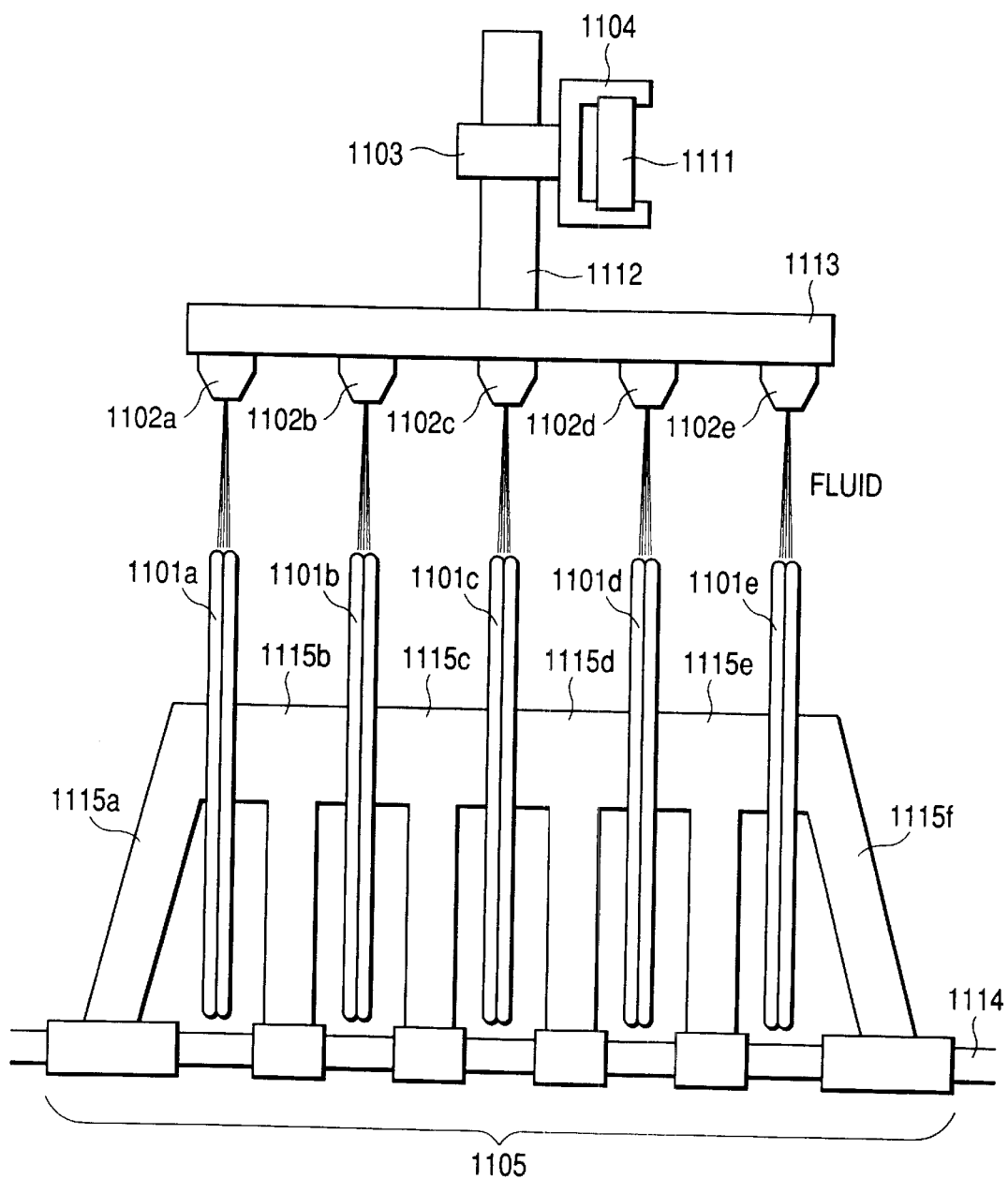
FIG. 13 is a schematic view showing still another example of a separation apparatus according to this invention.

FIG. 13 shows another separation apparatus according to this invention in which wafers 1101a, 1101b, 1101c, 1101d, and 1101e are set on a wafer holding means 1105. A plurality of nozzles 1102a to 1102e are installed in a set of nozzle movement mechanisms 1103 and 1104. The nozzle interval is the same as the wafer fixation interval. The holding mechanism and nozzle movement method are similar to those in FIG. 3.

By using the central axis of each wafer for alignment, the five wafers are each fixed between the holders 1115a and 1115b, between the holders 1115b and 1115c, between the holders 1115c and 1115d, between the holders 1115d and 1115e, or between the holders 1115e and 1115f, all of which can move on a guide 1114 in the horizontal direction.

A movable supply pipe 1112 acting as both a common fluid supply pipe and a nozzle vertical-movement mechanism is connected to the five nozzles 1102a to 1102e via a distributor 1113.

After the amount and pressure of fluid jetted from each nozzle have been stabilized at a nozzle standby position, all nozzles 1102a to 1102e are moved along the guide 1111 to a wafer separation position and then further advance along the guide 1111 to separate the wafers.

Once the separation has been finished, the amount of jetted fluid is reduced or the jetting is stopped to return the nozzles to their standby positions.

In the apparatuses shown in FIGS. 10A to 13, separation can be carried out by jetting the fluid while rotating the holders for the wafers to rotate the wafers.

Figure 14:
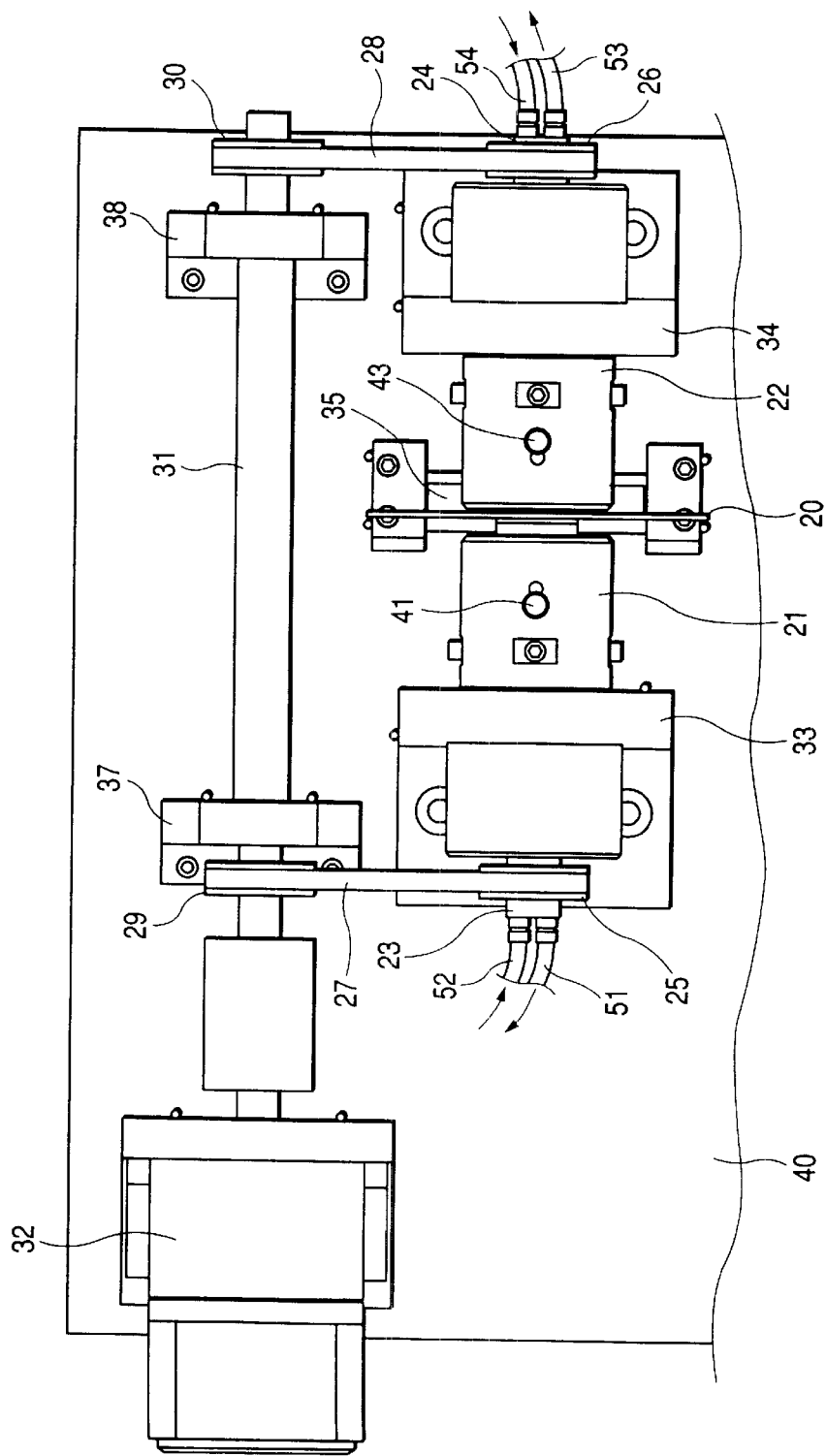
FIG. 14 is a top view of another separation apparatus according to this invention.
Figure 15:
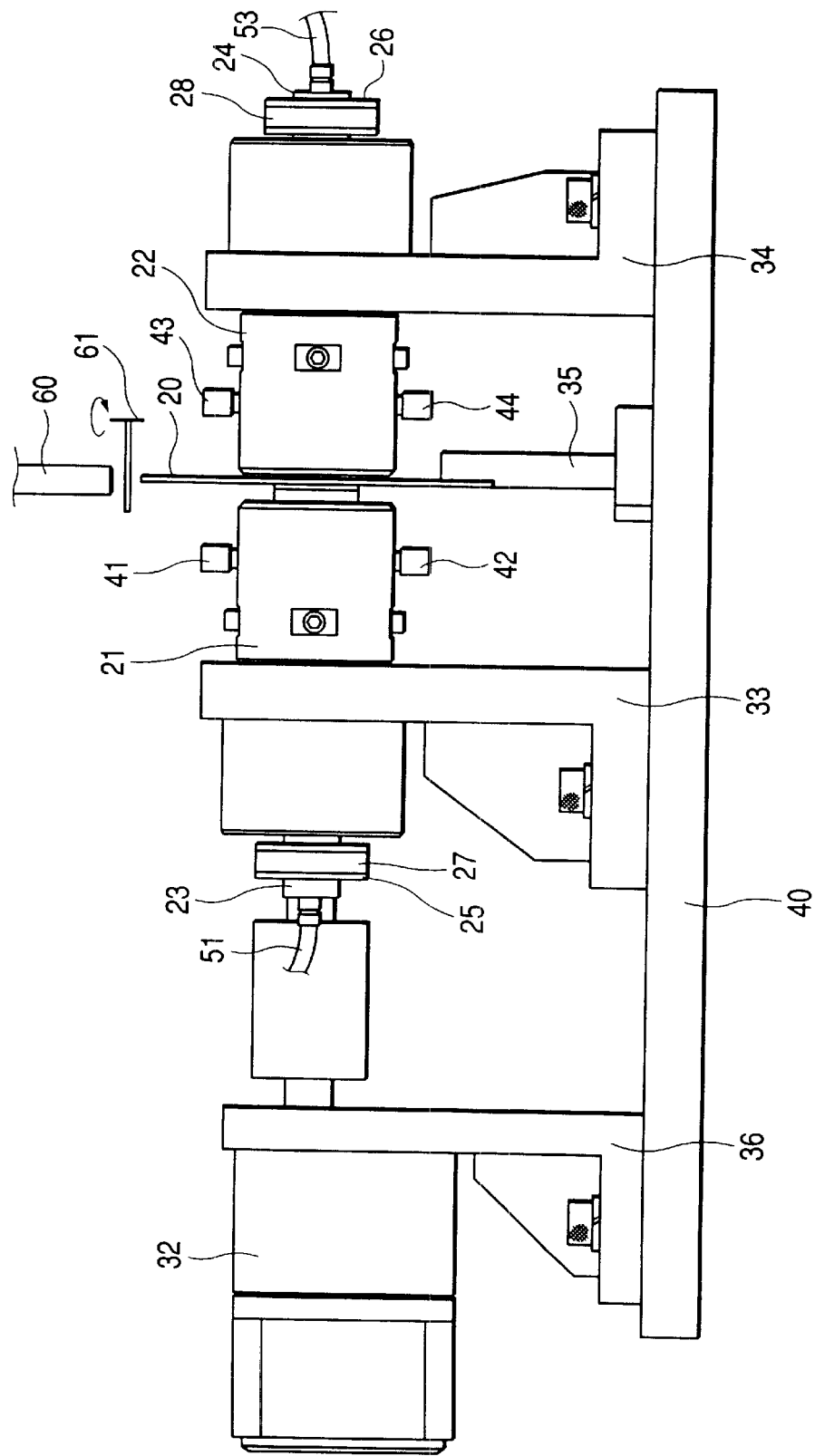
FIG. 15 is a side view of the separation apparatus shown in FIG. 14.

FIGS. 14 and 15 are a top and a side views showing a separation apparatus for a composite member used for this invention.

This separation apparatus has a rotation synchronization mechanism and can rotate a first holder for holding a first surface of the composite member and a second holder for holding a second surface of the composite member, at the same angular speed in the same direction.

When a rotational drive force is applied to only one surface of the composite member or synchronization such as that described above is not provided, the following phenomenon is likely to occur.

Immediately before a wafer that is a composite member is completely separated over the entire wafer, there is a moment at which a very small region, which is finally separated, remains unseparated somewhere on the separation surface. The following two separation modes can be assumed depending on a position of this very small unseparated region.

Figure 16:
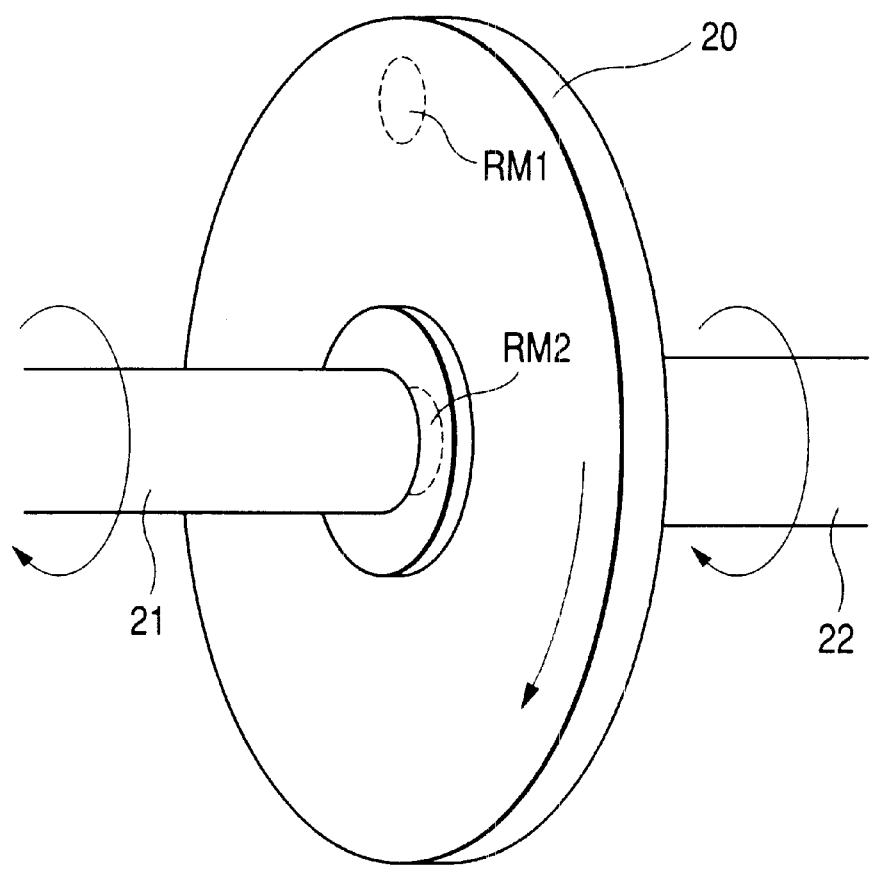
FIG. 16 is a schematic view showing a state of separating the composite member.

A first mode is a case in which the unseparated region remains almost at the center of the separation surface and a second mode is a case in which it remains in an area other than the center. FIG. 16 conceptually shows these modes.

The first mode occurs if separation progresses uniformly from the circumference of the wafer toward its center or if the strength of the vicinity of the center of the separation surface is high. In this case, if a rotational drive force is applied to only one of the holders 21 of one side of the wafer, this rotation causes the very small unseparated region to be twisted off and separated.

The second separation mode occurs if during the initial step of fluid jetting, a crack extends over the radius of the wafer or longer from a certain circumferential portion resulting in quick separation or if the strength of areas other than the vicinity of the center of the separation surface is high. In this case, if a rotational drive force is applied to only one of the holders 21 of one side of the wafer, this rotation causes sharing stress, thereby causing the very small unseparated region to be separated.

This is because the opposite holder 22 is subjected to no independent drive force and is only rotated through the wafer, causing a slight force to be effected in a direction in which the rotation of the holder 22 is stopped even if softly the holder 22 is held by a bearing.

Such torsion or shear causes complicated forces in directions other than the vertical one to be applied to the separation surface, resulting in the unwanted separation of an area other than the separation surface.

Thus, when the wafer is separated while being rotated and if the wafer is rotationally driven without allowing both sides of it to synchronize mutually, separation may occur from a surface other than a desired separation surface or the wafer or an active layer may be damaged. These phenomena may significantly reduce the yield.

A motor support 36 for supporting a motor 32 that can control the speed and a pair of shaft supports 37 and 38 for rotatably supporting a motor shaft 31 are fixed on a supporting stand 40.

Furthermore, a first holder support 33 for rotatably supporting the holder 21 and a second holder support 34 for rotatably supporting the holder 22 are fixed on the supporting stand 40.

A timing pulley 29 mounted on the motor shaft 31 and a timing pulley 25 mounted at the rear end of a rotating shaft 23 of the holder 21 are connected together in such a way as to rotate in the same direction by means of a timing belt 27.

Likewise, a timing pulley 30 mounted on the motor shaft 31 and a timing pulley 26 mounted at the rear end of a rotating shaft 24 of the holder 22 are connected together in such a way as to rotate in the same direction by means of a timing belt 28.

The pulleys 25 and 26 have the same driving radius, and the pulleys 29 and 30 have the same driving radius.

The timing belts 27 and 28 are the same.

A drive force from the motor 32 is transmitted from the shaft 31 to the holders 21 and 22 via the pulleys and belts in order to rotate the holders 21 and 22 at the same angular speed in the same direction with the same timing.

In FIG. 15, 60 is a jet nozzle that jets a fluid and 61 is a shutter. For clarity, the illustration of the nozzle and shutter are simplified.

The nozzle 60 is fixed on the supporting stand 40 using a fixation jig (not shown), and a wafer positioning member 35 is provided on the supporting stand 40 so as to be aligned with the nozzle 60.

Figure 17:
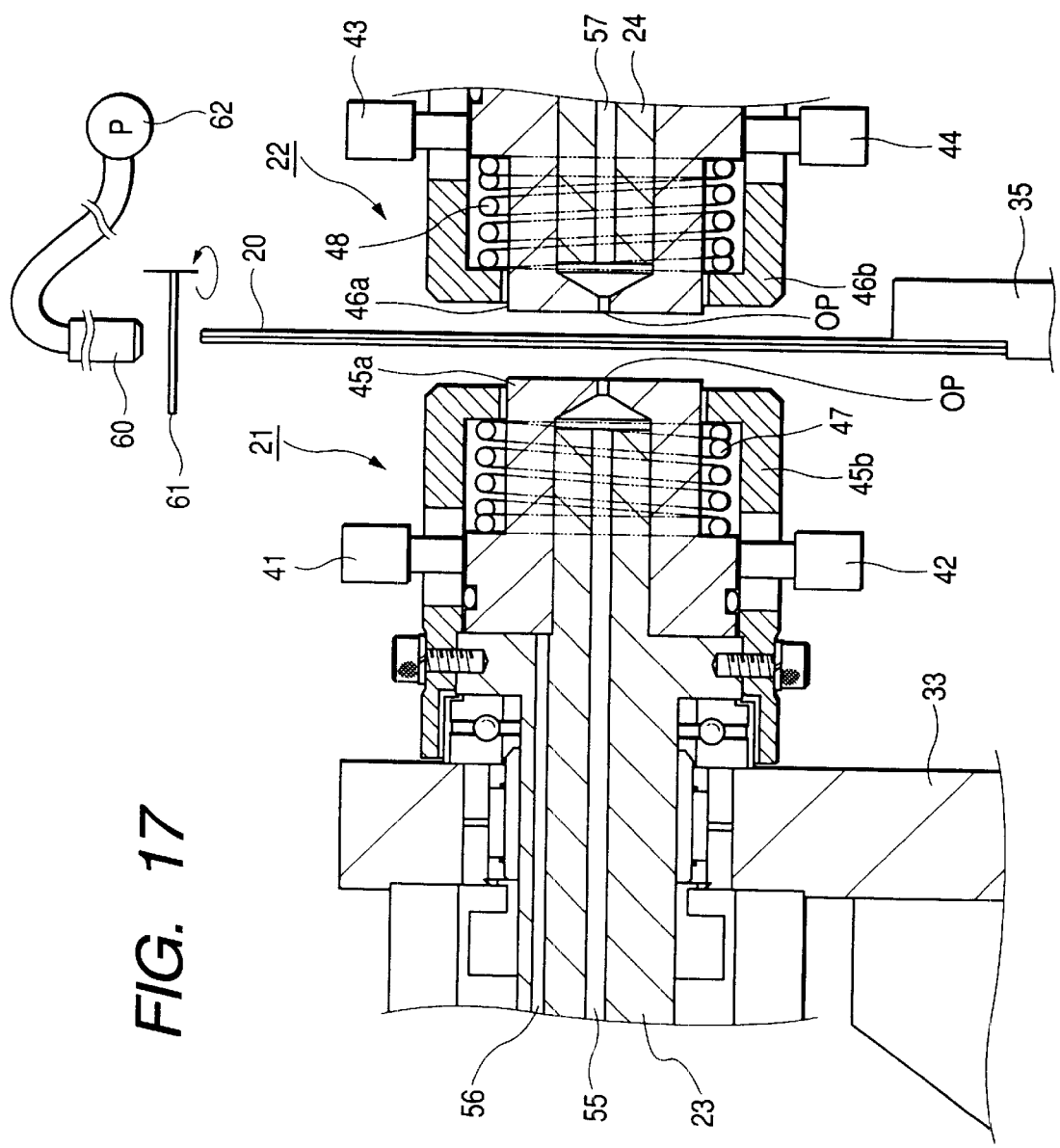
FIG. 17 is a sectional view of the separation apparatus shown in FIG. 15, in its standby state.

FIG. 17 is a partially sectional view of the holder of the separation apparatus before it holds the wafer 20.

The holder 21 or 22 is an assembly of a holding section 45a or 46a that actually sucks and holds a wafer; a fixation section 45b or 46b that rotates the holding section 45a or 46a together with the rotating shaft 23 or 24; and detents 41 and 42 or 43 and 44.

Using a tube 52 and a pressurized gas passed through a pressurizing passage 56, the holding section 45a can move against a compression spring (a coil spring 47) in a direction in which it leaves the rotating shaft 23 (rightward in the figure).

An opening op is provided near the center of the holding section 45a and is in communication with a pressure reducing passage 55 in the rotating shaft. Using a vacuum pump (not shown) connected to the opening op via a pressure reducing tube 51, vacuum is drawn into the opening op to reduce the atmospheric pressure.

The holder 21 or 22 is moved forward (rightward in the figure) by having its holder section 45a that directly sucks the wafer, guided by the rotating shaft 23, as shown in FIG. 17, and using the pressure of air introduced from the pressurizing tube 52. The holder 21 or 22 is moved backward (leftward in the figure) by the compression spring 47. The holding section 45a rotates with the rotating shaft 23 using the detents 41 and 42. Basically, the holder 22 is specularly symmetrical with the holder 21 and has the same mechanism as it. To allow the bonded wafer 20 and nozzle 60 to be always set at specified positions when the bonded wafer 20 is positioned and held on the holder 22, pressure is controlled and adjusted so that a stronger force is applied to the holder 21 than to the holder 22 during a forward operation, while a stronger force is applied to the holder 22 than to the holder 21 during a backward operation.

Figure 18:
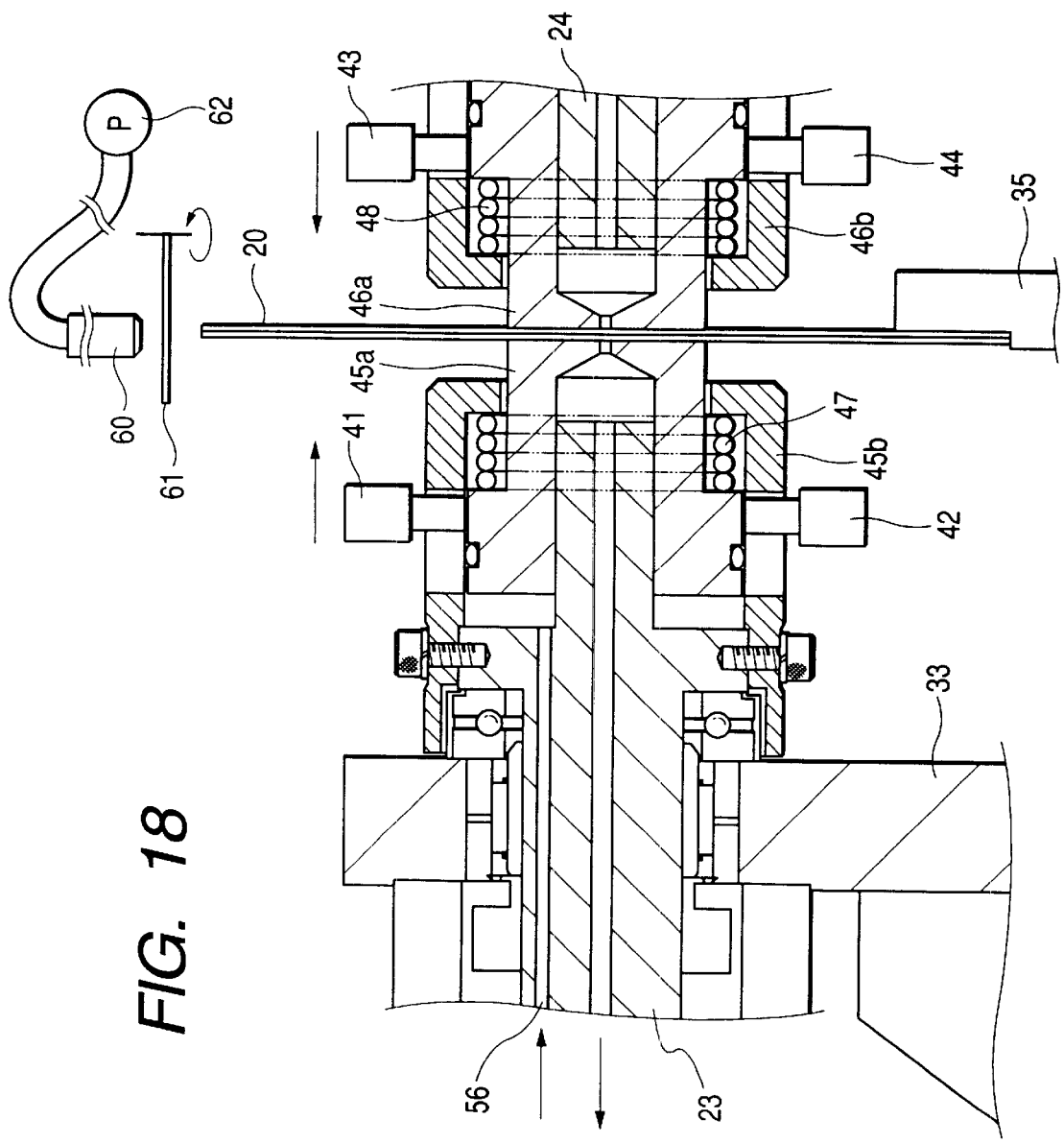
FIG. 18 is a sectional view of the separation apparatus shown in FIG. 15, in its substrate-holding state.

The usage of this apparatus, that is, the method for separating a composite member according to this invention is described below. The bonded wafer 20 is set so as to fit on a notch in a positioning stand 35, as shown in FIG. 17. Pressurized air is then introduced to cause the holding section 45a to advance, thereby allowing the holder 21 to suck and hold the wafer, as shown in FIG. 18. The holder 21 can fit the bonded wafer 20 on the notch in the positioning stand 35 to hold the center of the bonded wafer 20. When the bonded wafer 20 is held in an accurate position, the nozzle 60 is located perpendicularly to the top of the bonded wafer 20 and the distance between the bonded wafer 20 and the nozzle 60 is 10 to 30 mm. The holding section 46a of the holder 22 is moved forward (leftward in the figure) to suck and hold the bonded wafer 20, and the feeding of pressurized air of the holding section 46a is stopped. The bonded wafer 20 is stopped due to a force acting rightward in the figure which is an combination of a force effected by the compression spring and a vacuum suction force. The force effected by the compression spring does not exceed the force required by the holding section 46a to suck the bonded wafer 20, so the vacuum destruction of the inside of the pressure reducing passage 55 or 57 does not occur, which may in turn eliminate the suction force to cause the wafer 20 to fall.

A fluid is then fed from a pump 62 to the nozzle 60 for a specified period of time until the jetted fluid is stabilized. Once the fluid has been stabilized, the shutter 61 is opened to jet the high-pressure fluid from the nozzle 60 against the thickness-wise center of the bonded wafer 20. At this point, the speed controller motor 32 is rotated to rotate the holders 21 and 22 in synchronism in order to rotate the wafer 20. By jetting the high-pressure fluid against the thickness-wise center of the wafer 20, the high-pressure fluid also enters the separation region to extend the bonded wafer 20, thereby finally separating it into two.

Since the high-pressure fluid is applied uniformly against the bonded wafer 20 and the holders 21 and 22 each apply a force in a direction in which the bonded wafer 20 is drawn, as described above, separated pieces further leave each other and are prevented from sliding.

In addition, in the wafer supporting means shown in FIGS. 17 to 20, the wafer is supported while being subjected to a force by the holders 21 and 22 in a direction in which the holders move backward from the wafer, but the holders 21 and 22 may effect a force in a forward direction and this pressure may be used to hold the wafer. In this case, the high-pressure fluid also advances while extending the bonded wafer 20 to create a small gap, thereby finally causing the wafer to be separated into two. In this method, if the holders 21 and 22 do not synchronize mutually, the bonding surfaces of the separated pieces damage each other due to sliding, whereas if the holders rotate in synchronism, no damage occurs. Furthermore, when a force is applied in a direction in which the holders 21 and 22 move backward, the wafer 20 is pulled to move backward during separation by the holders 21 and 22 and there may occur a difference in the amount of displacement between a separated portion and an unseparated portion to unbalance the bonded wafer 20, thereby causing a crack when the high-pressure fluid is jetted. If, however, a force is applied to the holders 21 and 22 in a direction in which they move forward, the bonded wafer 20 will maintain balance to enable the wafer to be separated stably.

A high- or atmospheric-pressure fluid can be injected against the entirely separated wafer to effect a force in a direction in which it moves backward in order to break the surface tension of intervening water, thereby separating it into two completely.

As described above, the separation apparatus according to this invention sequentially or simultaneously separates one or more composite members using a fluid. The composite members may be juxtaposed in the normal direction of the surface or in parallel with the surface.

Alternatively, the composite members may be rotated or moved parallel with the surface to receive the fluid, or the flow of the fluid may be moved parallel with the surface so as to hit against the sides of the composite members, or the composite members and fluid may be moved together.

EXAMPLE 1
(One Porous Layer and Nozzle Scanning)

A first P-type (or N-type) single crystal Si substrate having a resistivity of 0.01 $\Omega \cdot cm$ was placed in an HF solution for anodization. The anodization conditions are listed below.

Current density: 7 ($mA \cdot cm^{-2}$)
Anodization solution: $HF:H_2O:C_2H_5OH=1:1:1$
Time: 11 (minute)
Thickness of the porous Si layer: 12 ($\mu m$)

The porous Si layer is also used as a separation layer to form a high-quality epitaxial Si layer, that is, a single porous Si layer provides multiple functions.

The thickness of the porous Si layer is not limited to the above value but may be between 0.1 and several hundred $\mu m$.

This substrate was oxidized in an oxygen atmosphere at 400° C. for one hour. The oxidization caused the inner wall of the pores in the porous Si layer to be covered with a thermally oxidized film. The surface of the porous Si layer was treated with hydrofluoric acid to remove only the oxidized film on the surface of the porous Si layer while leaving the oxidized film on the inner wall of the pores, and the CVD was then used to allow single crystal Si to epitaxially grow by 0.3 $\mu m$ on the porous Si layer. The growth conditions are listed below.

Source gas: $SiH_2Cl_2/H_2$
Gas flow rate: 0.5/180 l/min.
Gas pressure: 80 Torr
Temperature: 950° C.
Growth speed: 0.3 $\mu m$/min.

Furthermore, a 200 nm thick oxide film (an $SiO_2$ layer) was formed on the epitaxial Si layer as an insulating layer, using thermal oxidation.

The surface of a separately prepared second Si substrate was placed on the surface of the $SiO_2$ layer to contact them mutually. These substrates were then subjected to thermal treatment at 1180° C. for five minutes for bonding.

To separate the bonded substrate formed in this manner using the apparatus shown in FIG. 3, this bonded wafer was supported from both sides by the wafer holders so as to stand perpendicularly. An abrasive-material-free and high-pressure pure water was jetted at 2,000 kgf/$cm^2$ from a 0.15-mm nozzle of a water jet apparatus located above the wafer against a gap in the wafer formed by bevelling, from a direction parallel with a bonding interface (surface) in the bonded wafer. A nozzle horizontal drive mechanism was used to scan the nozzle in a direction in which the high-pressure pure water moved along the gap formed by bevelling. In this case, when an elastomer 106 (e.g., Viton, fluoro rubber, or silicone rubber) was used in the portion in which the wafer and holder contact each other, the wafer could be opened in the vertical direction relative to its surface to allow the high-pressure water to enter that part of the porous Si layer which was sandwiched by the wafer holders, thereby enabling the wafer to be separated.

As a result, the $SiO_2$ layer, the epitaxial Si layer, and part of the porous Si layer which were originally formed on the surface of the first substrate were transferred to the second substrate. Only the remaining part of the porous Si layer remained on the surface of the first substrate.

Subsequently, the porous Si layer transferred to the second substrate was selectively etched by being stirred using a mixture of 49% hydrofluoric acid and 30% hydrogen peroxide solution. The single crystal Si layer remained without being etched, whereas the porous Si layer was entirely removed by selective etching using the single crystal Si layer as an etch stop material.

The speed at which a nonporous Si single crystal is etched by the etching solution is very low, and the selective ratio of this etching speed and the etching speed of the porous layer is $1:10^5$ or more. Thus, the amount of the etched portion of the nonporous layer (about several tens of Angstrom) corresponds to the practically negligible reduction of the thickness.

The single crystal Si layer of 0.2 $\mu$m thickness was formed on the Si oxide film. The single crystal Si layer was not affected by the selective etching of the porous Si layer. When 100 points of the overall surface of the single crystal Si layer formed were measured for thickness, the value obtained was 201 nm±4 nm.

An observation of the cross section by a transmission electron microscope indicated that new crystal defects did not occur in the Si layer and that excellent crystallinity was maintained.

Thermal treatment was further carried out in hydrogen at 1100° C. for one hour and the surface roughness was evaluated using an interatomic force microscope. The mean square roughness of a 50-$\mu$m square region was about 0.2 nm and was similar to that of commercially available Si wafers.

Similar effects can be obtained by forming the oxide film on the surface of the second substrate instead of the surface of the epitaxial layer or forming it on both surfaces.

In addition, the porous Si layer remaining on the first substrate was selectively etched by being stirred using a mixture of 40% hydrofluoric acid and 30% hydrogen peroxide solution. Subsequently, using hydrogen annealing or surface treatment such as surface polishing, the first or second substrate could be reused for the above process.

EXAMPLE 2
(Two Porous Layers and Nozzle Scanning)

A first P-type single crystal Si substrate having a resistivity of 0.01 $\Omega$·cm was subjected to two-step anodization in an HF solution to form two porous layers. The anodization conditions are listed below.

First Step:
  Current density: 7 (mA·$cm^{-2}$)
  Anodization solution: $HF:H_2O:C_2H_5OH=1:1:1$
  Time: 5 (minute)
  Thickness of the first porous Si layer: 4.5 ($\mu$m)

Second Step:
  Current density: 30 (mA·$cm^{-2}$)
  Anodization solution: $HF:H_2O:C_2H_5OH=1:1:1$
  Time: 10 (second)
  Thickness of the second porous Si layer: 0.2 ($\mu$m)

The two porous Si layers were formed, and the surface porous-Si layer anodized by a low current was used to form a high-quality epitaxial Si layer while the lower porous Si layer anodized by a high current was used as a separation layer. That is, the functions were assigned to the different layers. Thus, the thickness of the low-current porous Si layer is not limited to the above value but may be between 0.1 to several hundred $\mu$m.

In addition, a third and subsequent layers may be formed on the second porous Si layer.

This substrate was oxidized in an oxygen atmosphere at 400° C. for one hour. The oxidization caused the inner wall of the pores in the porous Si layer to be covered with a thermally oxidized film. The surface of the porous Si layer was treated with hydrofluoric acid to remove only the oxidized film on the surface of the porous Si layer while leaving the oxidized film on the inner wall of the pores, and the CVD was then used to allow single crystal Si to epitaxially grow by 0.3 $\mu$m on the porous Si layer. The growth conditions are listed below.

Source gas: $SiH_2Cl_2/H_2$
  Gas flow rate: 0.5/180 l/min.
  Gas pressure: 80 Torr
  Temperature: 950° C.
  Growth speed: 0.3 $\mu$m/min.

Furthermore, a 200 nm thick oxide film (an $SiO_2$ layer) was formed on the epitaxial Si layer as an insulating layer, using thermal oxidation.

The surface of a separately prepared second Si substrate was placed on the surface of the $SiO_2$ layer to contact them mutually. These substrates were then subjected to thermal treatment at 1180° C. for five minutes for bonding.

The bonded substrate formed in this manner was separated using the apparatus shown in FIG. 3. A separation process similar to that in Embodiment 1 was used. As a result, the $SiO_2$ layer, the epitaxial Si layer, and part of the porous Si layer which were originally formed on the surface of the first substrate were transferred to the second substrate. Only the remaining part of the porous Si layer remained on the surface of the first substrate.

Subsequently, the porous Si layer transferred to the second substrate was selectively etched by being stirred using a mixture of 49% hydrofluoric acid and 30% hydrogen peroxide solution. The single crystal Si layer remained without being etched, whereas the porous Si layer was entirely removed by selective etching using the single crystal Si layer as an etch stop material.

The single crystal Si layer of 0.2 $\mu$m thickness was formed on the Si oxide film. The single crystal Si layer was not affected by the selective etching of the porous Si layer. When 100 points of the overall surface of the single crystal Si layer formed were measured for thickness, the value obtained was 200 nm±4 nm.

An observation of the cross section by the transmission electron microscope indicated that new crystal defects did not occur in the Si layer and that excellent crystallinity was maintained.

Thermal treatment was further carried out in hydrogen at 1100° C. for one hour and the surface roughness was evaluated using the interatomic force microscope. The mean square roughness of a 50-$\mu$m square region was about 0.2 nm and was similar to that of commercially available Si wafers.

Similar effects can be obtained by forming the oxide film on the surface of the second substrate instead of the surface of the epitaxial layer or forming it on both surfaces.

In addition, the porous Si layer remaining on the first substrate was selectively etched by being stirred using a mixture of 49% hydrofluoric acid and 30% hydrogen peroxide solution. Subsequently, using hydrogen annealing or surface treatment such as surface polishing, the first or second substrate could be reused to repeat the above process.

EXAMPLE 3
(Porous Si Layer+separation Layer Formed by Ion Implantation and Nozzle Scanning)

A first P-type single crystal Si substrate having a resistivity of 0.01 $\Omega$·cm was subjected to anodization in an HF solution.

The anodization conditions are listed below.

Current density: 7 (mA·cm$^{-2}$)

Anodization solution: HF:H$_2$O:C$_2$H$_5$OH=1:1:1

Time: 11 (minute)

Thickness of the porous Si layer: 12 ($\mu$m)

This substrate was oxidized in an oxygen atmosphere at 400° C. for one hour. The oxidization caused the inner wall of the pores in the porous Si layer to be covered with a thermally oxidized film. The surface of the porous Si layer was treated with hydrofluoric acid to remove only the oxidized film on the surface of the porous Si layer while leaving the oxidized film on the inner wall of the pores, and the CVD was then used to allow single crystal Si to epitaxially grow by 0.3 $\mu$m on the porous Si layer. The growth conditions are listed below.

Source gas: SiH$_2$Cl$_2$/H$_2$

Gas flow rate: 0.5/180 l/min.

Gas pressure: 80 Torr

Temperature: 950° C.

Growth speed: 0.3 $\mu$m/min.

Furthermore, a 200-nm oxide film (an SiO$_2$ layer) was formed on the epitaxial Si layer as an insulating layer, using thermal oxidation.

Ions were implanted from the surface of the first substrate in such a way that their projected flights exists within the epitaxial layer/porous Si interface, the porous Si/substrate interface, or the porous Si layer. This allowed a layer acting as a separation layer to be formed at a depth corresponding to the projected flight as a strain layer formed by microcavities or concentrated implanted ions.

After pre-treatment such as N$_2$ plasma processing, the surface of a separately prepared second Si substrate was placed on the surface of the SiO$_2$ layer to contact them mutually. These substrates were then subjected to thermal treatment at 600° C. for 10 hours for bonding.

The bonded substrate formed in this manner was separated using the apparatus shown in FIG. 3. A separation process similar to that in Example 1 was used. As a result, the SiO$_2$ layer, the epitaxial Si layer, and part of the porous Si layer which were originally formed on the surface of the first substrate were transferred to the second substrate. Only the remaining part of the porous Si layer remained on the surface of the first substrate.

Subsequently, the porous Si layer transferred to the second substrate was selectively etched by being stirred using a mixture of 49% hydrofluoric acid and 30% hydrogen peroxide solution. The single crystal Si layer remained without being etched, whereas the porous Si layer was entirely removed by selective etching using the single crystal Si layer as an etch stop material.

The single crystal Si layer of 0.2 $\mu$m thickness was formed on the Si oxide film. The single crystal Si layer was not affected by the selective etching of the porous Si layer. When 100 points of the overall surface of the single crystal Si layer formed were measured for thickness, the value obtained was 201 nm±4 nm.

An observation of the cross section by the transmission electron microscope indicated that new crystal defects did not occur in the Si layer and that excellent crystallinity was maintained.

Thermal treatment was further carried out in hydrogen at 1100° C. for one hour and the surface roughness was evaluated using the interatomic force microscope. The mean square roughness of a 50-$\mu$m square region was about 0.2 nm and was similar to that of commercially available Si wafers.

Similar effects can be obtained by forming the oxide film on the surface of the second substrate instead of the surface of the epitaxial layer or forming it on both surfaces.

In addition, the porous Si layer remaining on the first substrate was selectively etched by being stirred using a mixture of 49% hydrofluoric acid and 30% hydrogen peroxide solution. Subsequently, using hydrogen annealing or surface treatment such as surface polishing, the first or second substrate could be reused to repeat the above process.

According to this example, the ion implantation was carried out after the formation of the epitaxial Si layer, but ions may be implanted into the porous Si layer or the porous Si/Si substrate interface prior to the epitaxial growth.

EXAMPLE 4
(Bubble Layer Formed by Ion Implantation and Nozzle Scanning)

A 200 nm thick oxide film (an SiO$_2$ layer) was formed on the first single crystal Si layer as an insulating layer, using thermal oxidation.

Ions were implanted from the surface of the first substrate in such a way that their projected flight exists within the Si substrate. This allowed a layer acting as a separation layer to be formed at a depth corresponding to the projected flight as a strain layer formed by microcavities or concentrated implanted ions.

After pre-treatment such as N$_2$ plasma processing, the surface of a separately prepared second Si substrate was placed on the surface of the SiO$_2$ layer to contact them mutually. These substrates were then subjected to thermal treatment at 600° C. for 10 hours for bonding.

The bonded substrate formed in this manner was separated using the apparatus shown in FIG. 3. A separation process similar to that in Example 1 was used.

As a result, the SiO$_2$ layer, the surface single crystal layer, and part of the separation layer which were originally formed on the surface of the first substrate were transferred to the second substrate. Only the remaining part of the separation layer remained on the surface of the first substrate.

Subsequently, the separation layer transferred to the second substrate was selectively etched by being stirred using a mixture of 49% hydrofluoric acid and 30% hydrogen peroxide solution. The single crystal Si layer remained without being etched, whereas the separation layer was entirely removed by selective etching using the single crystal Si layer as an etch stop material.

This etching step may be omitted if the remaining separation layer is sufficiently thin.

The single crystal Si layer of 0.2 $\mu$m thickness was formed on the Si oxide film. The single crystal Si layer was not affected by the selective etching of the separation layer. When 100 points of the overall surface of the single crystal Si layer formed were measured for thickness, the value obtained was 201 nm±4 nm.

An observation of the cross section by the transmission electron microscope indicated that new crystal defects did not occur in the Si layer and that excellent crystallinity was maintained.

Thermal treatment was further carried out in hydrogen at 1100° C. for one hour and the surface roughness was evaluated using the interatomic force microscope. The mean square roughness of a 50-$\mu$m square region was about 0.2 nm and was similar to that of commercially available Si wafers.

Similar effects can be obtained by forming the oxide film on the surface of the second substrate instead of the surface of the epitaxial layer or forming it on both surfaces.

In addition, the separation layer remaining on the first substrate was selectively etched by being stirred using a mixture of 49% hydrofluoric acid and 30% hydrogen peroxide solution. Subsequently, using hydrogen annealing or surface treatment such as surface polishing, the first or second substrate could be reused to repeat the above process.

According to this example, the surface area of the Si wafer is transferred to the second substrate via the separation layer formed by ion implantation, but an epi-wafer may be used to transfer the epitaxial layer to the second substrate via the separation layer formed by ion implantation. The following process is also possible. After the ion implantation according to this example, the surface $SiO_2$ is removed and the epitaxial layer and then the $SiO_2$ layer are formed, followed by the bonding step. The epitaxial layer is then transferred to the second substrate via the separation layer formed by ion implantation. In the latter case, the surface area of the Si wafer is also transferred.

EXAMPLE 5
(Horizontal Placement and Movement of the Wafer)

A first P-type single crystal Si substrate having a resistivity of 0.01 $\Omega$·cm was subjected to anodization in an HF solution. The anodization conditions are listed below.

Current density: 7 (mA·cm$^{-2}$)
Anodization solution: $HF:H_2O:C_2H_5OH=1:1:1$
Time: 11 (minute)
Thickness of the porous Si layer: 12 ($\mu$m)

Porous Si was used to form a high-quality epitaxial Si layer and as a separation layer.

The thickness of the porous Si layer is not limited to the above value but may be between 0.1 to several hundred $\mu$m.

This substrate was oxidized in an oxygen atmosphere at 400° C. for one hour. The oxidization caused the inner wall of the pores in the porous Si layer to be covered with a thermally oxidized film. The surface of the porous Si layer was treated with hydrofluoric acid to remove only the oxidized film on the surface of the porous Si layer while leaving the oxidized film on the inner wall of the pores, and the CVD was then used to allow single crystal Si to epitaxially grow by 0.3 $\mu$m on the porous Si layer. The growth conditions are listed below.

Source gas: $SiH_2Cl_2/H_2$
Gas flow rate: 0.5/180 l/min.
Gas pressure: 80 Torr
Temperature: 950° C.
Growth speed: 0.3 $\mu$m/min.

Furthermore, a 200 nm thick oxide film (an $SiO_2$ layer) was formed on the epitaxial Si layer as an insulating layer, using thermal oxidation.

The surface of a separately prepared second Si substrate was placed on the surface of the $SiO_2$ layer to contact them mutually. These substrates were then subjected to thermal treatment at 1180° C. for 5 minutes for bonding.

The bonded substrate formed in this manner was separated using the apparatus shown in FIG. 5. The wafer cassette 205 was placed on the cassette base 207 in such a way that the wafer 201 extended in the horizontal direction, as shown in FIG. 5. High-pressure pure water at 2,000 kgf/cm$^2$ was jetted from the 0.15-mm nozzles 202 and 203 of the water jet apparatus located on the side of the wafer against the bonding region in the bonded wafer through the gap therein formed by bevelling, from a direction parallel with the bonding interface (surface) in the bonded wafer. The nozzles were fixed and the bonded wafer was scanned in the horizontal direction to receive the high-pressure pure water along the gap formed by bevelling.

This operation allowed the wafer to be divided into two via the porous Si layer. Then, another loading robot was used to store and collect the separated wafer as a first and a second substrates.

The $SiO_2$ layer, the epitaxial Si layer, and part of the porous Si layer which were originally formed on the surface of the first substrate were transferred to the second substrate. Only the remaining part of the porous Si layer remained on the surface of the first substrate.

Subsequently, the porous Si layer transferred to the second substrate was selectively etched by being stirred using a mixture of 49% hydrofluoric acid and 30% hydrogen peroxide solution. The single crystal Si layer remained without being etched, whereas the porous Si layer was entirely removed by selective etching using the single crystal Si layer as an etch stop material.

The single crystal Si layer of 0.2 $\mu$m thickness was formed on the Si oxide film. The single crystal Si layer was not affected by the selective etching of the porous Si layer. When 100 points of the overall surface of the single crystal Si layer formed were measured for thickness, the value obtained was 200 nm±5 nm.

An observation of the cross section by the transmission electron microscope indicated that new crystal defects did not occur in the Si layer and that excellent crystallinity was maintained.

Thermal treatment was further carried out in hydrogen at 1100° C. for one hour and the surface roughness was evaluated using the interatomic force microscope. The mean square roughness of a 50-$\mu$m square region was about 0.2 nm and was similar to that of commercially available Si wafers.

Similar effects can be obtained by forming the oxide film on the surface of the second substrate instead of the surface of the epitaxial layer or forming it on both surfaces.

In addition, the porous Si layer remaining on the first substrate was selectively etched by being stirred using a mixture of 49% hydrofluoric acid and 30% hydrogen peroxide solution. Subsequently, using hydrogen annealing or surface treatment such as surface polishing, the first or second substrate could be reused to repeat the above process.

EXAMPLE 6
(Oscillation of the Nozzle)

A first P-type single crystal Si substrate having a resistivity of 0.01 Ω·cm was subjected to anodization in an HF solution.

The anodization conditions are listed below.
Current density: 7 (mA·cm$^{-2}$)
Anodization solution: HF:H$_2$O:C$_2$H$_5$OH=1:1:1
Time: 11 (minute)
Thickness of the porous Si layer: 12 ($\mu$m)

Porous Si was used to form a high-quality epitaxial Si layer and as a separation layer.

This substrate was oxidized in an oxygen atmosphere at 400° C. for one hour. The oxidization caused the inner wall of the pores in the porous Si layer to be covered with a thermally oxidized film. The surface of the porous Si layer was treated with hydrofluoric acid to remove only the oxidized film on the surface of the porous Si layer while leaving the oxidized film on the inner wall of the pores, and the CVD was then used to allow single crystal Si to epitaxially grow by 0.3 $\mu$m on the porous Si layer. The growth conditions are listed below.

Source gas: SiH$_2$Cl$_2$/H$_2$
Gas flow rate: 0.5/180 l/min.
Gas pressure: 80 Torr
Temperature: 950° C.
Growth speed: 0.3 $\mu$m/min.

Furthermore, a 200 nm thick oxide film (an SiO$_2$ layer) was formed on the epitaxial Si layer as an insulating layer, using thermal oxidation.

The surface of a separately prepared Si substrate was placed on the surface of the SiO$_2$ layer to contact them mutually. These substrates were then subjected to thermal treatment at 1180° C. for 5 minutes for bonding.

The bonded substrate formed in this manner was separated using the apparatus shown in FIG. 6. As shown in this figure, the bonded wafer 301 was allowed to stand in the vertical direction, and high-pressure pure water at 2,000 kgf/cm$^2$ was jetted from the 0.15-mm nozzle 302 of the water jet apparatus located above the wafer against the bonding region in the bonded wafer through the gap therein formed by bevelling, from a direction parallel with the bonding interface (surface) in the bonded wafer. Then, the nozzle 302 was oscillated within the same plane as the bonding surface in the wafer so as to draw a fan, in order to oscillate the flow of the jet within this plane.

This operation allowed the wafer to be divided into two via the porous Si layer. As a result, the SiO$_2$ layer, the epitaxial Si layer, and part of the porous Si layer which were originally formed on the surface of the first substrate were transferred to the second substrate. Only the remaining part of the porous Si layer remained on the surface of the first substrate.

Subsequently, the porous Si layer transferred to the second substrate was selectively etched by being stirred using a mixture of 49% hydrofluoric acid and 30% hydrogen peroxide solution. The single crystal Si layer remained without being etched, whereas the porous Si layer was entirely removed by selective etching using the single crystal Si layer as an etch stop material.

The single crystal Si layer of 0.2 $\mu$m thickness was formed on the Si oxide film. The single crystal Si layer was not affected by the selective etching of the porous Si layer. When 100 points of the overall surface of the single crystal Si layer formed were measured for thickness, the value obtained was 201 nm±4 nm.

An observation of the cross section by the transmission electron microscope indicated that new crystal defects did not occur in the Si layer and that excellent crystallinity was maintained.

Thermal treatment was further carried out in hydrogen at 1100° C. for one hour and the surface roughness was evaluated using the interatomic force microscope. The mean square roughness of a 50-$\mu$m square region was about 0.2 nm and was similar to that of commercially available Si wafers.

Similar effects can be obtained by forming the oxide film on the surface of the second substrate instead of the surface of the epitaxial layer or forming it on both surfaces.

In addition, the porous Si layer remaining on the first substrate was selectively etched by being stirred using a mixture of 49% hydrofluoric acid and 30% hydrogen peroxide solution. Subsequently, using hydrogen annealing or surface treatment such as surface polishing, the first or second substrate could be reused to repeat the above process. Similar results were obtained by separating wafers in which a separation layer was formed according to Examples 2 to 4.

EXAMPLE 7
(Rotation of the Wafer)

A first P-type single crystal Si substrate having a resistivity of 0.01 Ω·cm was subjected to anodization in an HF solution.

The anodization conditions are listed below.
Current density: 7 (mA·cm$^{-2}$)
Anodization solution: HF:H$_2$O:C$_2$H$_5$OH=1:1:1
Time: 11 (minute)
Thickness of the porous Si layer: 12 ($\mu$m)

Porous Si was used to form a high-quality epitaxial Si layer and as a separation layer.

This substrate was oxidized in an oxygen atmosphere at 400° C. for one hour. The oxidization caused the inner wall of the pores in the porous Si layer to be covered with a thermally oxidized film. The surface of the porous Si layer was treated with hydrofluoric acid to remove only the oxidized film on the surface of the porous Si layer while leaving the oxidized film on the inner wall of the pores, and the CVD was then used to allow single crystal Si to epitaxially grow by 0.3 $\mu$m on the porous Si layer. The growth conditions are listed below.

Source gas: SiH$_2$Cl$_2$/H$_2$
Gas flow rate: 0.5/180 l/min.
Gas pressure: 80 Torr
Temperature: 950° C.
Growth speed: 0.3 $\mu$m/min.

Furthermore, a 200 nm thick oxide film (an SiO$_2$ layer) was formed on the epitaxial Si layer as an insulating layer, using thermal oxidation.

The surface of a separately prepared second Si substrate was placed on the surface of the SiO$_2$ layer to contact them mutually. These substrates were then subjected to thermal treatment at 1180° C. for 5 minutes for bonding.

The bonded substrate formed in this manner was separated using the apparatus shown in FIG. 4.

A bonded wafer 401 was allowed to stand in the vertical direction.

The bonded wafer 401 was set so as to fit on a positioning pin 413 and was sucked and held by a holder 404. After the bonded wafer 401 was held in an accurate position so as to fit on the positioning pin 413, the nozzle 402 was moved until it was located perpendicularly to the top of the bonded wafer 401 and the distance between the wafer 401 and the nozzle 402 was set at 15 mm. Then, a holder 403 was moved forward (leftward in the figure) via a bearing 411 until it sucked and held the wafer 401.

Then, water without abrasive material grains was fed from a water jet pump 414 to the nozzle 402 for a specified period of time until the injected fluid was stabilized. Once the water had been stabilized, a shutter 406 was opened to inject the high-pressure pure water from the nozzle 402 against the thickness-wise center of the side of the bonded wafer 401. At this point, a holder 404 was rotated to rotate the bonded wafer 401 and holder 403. The high-pressure water also entered the porous Si layer to extend the bonded wafer 401, thereby enabling it to be finally separated into two.

Subsequently, the porous Si layer transferred to the second substrate was selectively etched by being stirred using a mixture of 49% hydrofluoric acid and 30% hydrogen peroxide solution. The single crystal Si layer remained without being etched, whereas the porous Si layer was entirely removed by selective etching using the single crystal Si layer as an etch stop material.

The single crystal Si layer of 0.2 $\mu$m thickness was formed on the Si oxide film. The single crystal Si layer was not affected by the selective etching of the porous Si layer. When 100 points of the overall surface of the single crystal Si layer formed were measured for thickness, the value obtained was 200 nm±3 nm.

An observation of the cross section by the transmission electron microscope indicated that new crystal defects did not occur in the Si layer and that excellent crystallinity was maintained.

Thermal treatment was further carried out in hydrogen at 1100° C. for one hour and the surface roughness was evaluated using the interatomic force microscope. The mean square roughness of a 50-$\mu$m square region was about 0.2 nm and was similar to that of commercially available Si wafers.

Similar effects can be obtained by forming the oxide film on the surface of the second substrate instead of the surface of the epitaxial layer or forming it on both surfaces.

In addition, the porous Si layer remaining on the first substrate was selectively etched by being stirred using a mixture of 49% hydrofluoric acid and 30% hydrogen peroxide solution. Subsequently, using hydrogen annealing or surface treatment such as surface polishing, the first or second substrate could be reused to repeat the above process.

Similar results were obtained by separating wafers in which a separation layer was formed according to Examples 2 to 4.

EXAMPLE 8

(Diagonal Injection)

A first P-type single crystal Si substrate having a resistivity of 0.01 $\Omega$·cm was subjected to anodization in an HF solution.

The anodization conditions are listed below.

Current density: 7 (mA·cm$^{-2}$)
Anodization solution: HF:H$_2$O:C$_2$H$_5$OH=1:1:1
Time: 11 (minute)
Thickness of the porous Si layer: 12 ($\mu$m)

Porous Si was used to form a high-quality epitaxial Si layer and as a separation layer.

The thickness of the porous Si layer is not limited to the above value but may be between 0.1 to several hundred $\mu$m.

This substrate was oxidized in an oxygen atmosphere at 400° C. for one hour. The oxidization caused the inner wall of the pores in the porous Si layer to be covered with a thermally oxidized film. The surface of the porous Si layer was treated with hydrofluoric acid to remove only the oxidized film on the surface of the porous Si layer while leaving the oxidized film on the inner wall of the pores, and the CVD was then used to allow single crystal Si to epitaxially grow by 0.3 $\mu$m on the porous Si layer. The growth conditions are listed below.

Source gas: SiH$_2$Cl$_2$/H$_2$
Gas flow rate: 0.5/180 l/min.
Gas pressure: 80 Torr
Temperature: 950° C.
Growth speed: 0.3 $\mu$m/min.

Furthermore, a 200 nm thick oxide film (an SiO$_2$ layer) was formed on the epitaxial Si layer as an insulating layer, using thermal oxidation.

The surface of a separately prepared second Si substrate was placed on the surface of the SiO$_2$ layer to contact them mutually. These substrates were then subjected to thermal treatment at 1180° C. for 5 minutes for bonding.

A bonded wafer was allowed to stand in the vertical direction, and high-pressure pure water at 2,000 kgf/cm$^2$ was jetted from the 0.15-mm diameter nozzle of the water jet apparatus located above the wafer against the bonding region in the bonded wafer through the gap therein formed by bevelling, from a direction inclined at an angle $\alpha$ from the bonding interface (surface).

The wafer was held by the apparatus shown in FIG. 4 and the nozzle was disposed as shown in FIG. 8 to inject the fluid against the side of the wafer.

Subsequently, the porous Si layer transferred to the second substrate was selectively etched by being stirred using a mixture of 49% hydrofluoric acid and 30% hydrogen peroxide solution. The single crystal Si layer remained without being etched, whereas the porous Si layer was entirely removed by selective etching using the single crystal Si layer as an etch stop material.

The single crystal Si layer of 0.2 $\mu$m thickness was formed on the Si oxide film. The single crystal Si layer was not affected by the selective etching of the porous Si layer. When 100 points of the overall surface of the single crystal Si layer formed were measured for thickness, the value obtained was 201 nm±4 nm.

An observation of the cross section by the transmission electron microscope indicated that new crystal defects did not occur in the Si layer and that excellent crystallinity was maintained.

Thermal treatment was further carried out in hydrogen at 1100° C. for one hour and the surface roughness was evaluated using the interatomic force microscope. The mean square roughness of a 50-$\mu$m square region was about 0.2 nm and was similar to that of commercially available Si wafers.

Similar effects can be obtained by forming the oxide film on the surface of the second substrate instead of the surface of the epitaxial layer or forming it on both surfaces.

In addition, the porous Si layer remaining on the first substrate was selectively etched by being stirred using a mixture of 49% hydrofluoric acid and 30% hydrogen peroxide solution. Subsequently, using hydrogen annealing or surface treatment such as surface polishing, the first or second substrate could be reused to repeat the above process.

Similar results were obtained by separating wafers in which a separation layer was formed according to Examples 2 to 4.

EXAMPLE 9
(A Plurality of Jets)

A first P-type single crystal Si substrate having a resistivity of 0.01 Ω·cm was subjected to anodization in an HF solution.

The anodization conditions are listed below.
Current density: 7 (mA·cm$^{-2}$)
Anodization solution: HF:H$_2$O:C$_2$H$_5$OH=1:1:1
Time: 11 (minute)
Thickness of the porous Si layer: 12 ($\mu$m)

Porous Si was used to form a high-quality epitaxial Si layer and as a separation layer.

The thickness of the porous Si layer is not limited to the above value but may be between 0.1 to several hundred $\mu$m.

This substrate was oxidized in an oxygen atmosphere at 400° C. for one hour. The oxidization caused the inner wall of the pores in the porous Si layer to be covered with a thermally oxidized film. The surface of the porous Si layer was treated with hydrofluoric acid to remove only the oxidized film on the surface of the porous Si layer while leaving the oxidized film on the inner wall of the pores, and the CVD was then used to allow single crystal Si to epitaxially grow by 0.3 $\mu$m on the porous Si layer. The growth conditions are listed below.

Source gas: SiH$_2$Cl$_2$/H$_2$
Gas flow rate: 0.5/180 l/min.
Gas pressure: 80 Torr
Temperature: 950° C.
Growth speed: 0.3 $\mu$m/min.

Furthermore, a 200-nm oxide film (an SiO$_2$ layer) was formed on the epitaxial Si layer, using thermal oxidation.

The surface of a separately prepared second Si substrate was placed on the surface of the SiO$_2$ layer to contact them mutually. These substrates were then subjected to thermal treatment at 1180° C. for 5 minutes for bonding.

The bonded substrate formed in this manner was separated using the apparatus shown in FIG. 9.

A shown in FIG. 9, the wafer holder 708 was used to hold both sides of the bonded wafer 701 so as to stand in the vertical direction. High-pressure pure water at 2,000 kgf/cm$^2$ was jetted against the gap in the wafer 701 formed by bevelling, through the 0.15 mm nozzles 702 to 704 of the three water jet apparatuses located above or on the side of the wafer, from a direction parallel with the bonding interface (surface) in the bonded wafer. A plurality of nozzles were scanned in a direction in which the high-pressure pure water moved along the gap formed by bevelling.

This operation allowed the wafer to be separated into two via the porous Si layer.

As a result, the SiO$_2$ layer, the epitaxial Si layer, and part of the porous Si layer which were originally formed on the surface of the first substrate were transferred to the second substrate. Only the remaining part of the porous Si layer remained on the surface of the first substrate.

Subsequently, the porous Si layer transferred to the second substrate was selectively etched by being stirred using a mixture of 49% hydrofluoric acid and 30% hydrogen peroxide solution. The single crystal Si layer remained without being etched, whereas the porous Si layer was entirely removed by selective etching using the single crystal Si layer as an etch stop material.

The single crystal Si layer of 0.2 $\mu$m thickness was formed on the Si oxide film. The single crystal Si layer was not affected by the selective etching of the porous Si layer. When 100 points of the overall surface of the single crystal Si layer formed were measured for thickness, the value obtained was 201 nm±4 nm.

An observation of the cross section by the transmission electron microscope indicated that new crystal defects did not occur in the Si layer and that excellent crystallinity was maintained.

Thermal treatment was further carried out in hydrogen at 1100° C. for one hour and the surface roughness was evaluated using the interatomic force microscope. The mean square roughness of a 50-$\mu$m square region was about 0.2 nm and was similar to that of commercially available Si wafers.

Similar effects can be obtained by forming the oxide film on the surface of the second substrate instead of the surface of the epitaxial layer or forming it on both surfaces.

In addition, the porous Si layer remaining on the first substrate was selectively etched by being stirred using a mixture of 49% hydrofluoric acid and 30% hydrogen peroxide solution. Subsequently, using hydrogen annealing or surface treatment such as surface polishing, the first or second substrate could be reused to repeat the above process.

Similar results were obtained by separating wafers in which a separation layer was formed according to Examples 2 to 4.

The bonded wafer could also be separated efficiently by using a plurality of nozzles in the water jet injection methods according to Examples 5 to 8.

EXAMPLE 10
(Slit Jet)

A first P-type single crystal Si substrate having a resistivity of 0.01 Ω·cm was subjected to anodization in an HF solution.

The anodization conditions are listed below.
Current density: 7 (mA·cm$^{-2}$)
Anodization solution: HF:H$_2$O:C$_2$H$_5$OH=1:1:1
Time: 11 (minute)
Thickness of the porous Si layer: 12 ($\mu$m)

Porous Si was used to form a high-quality epitaxial Si layer and as a separation layer.

The thickness of the porous Si layer is not limited to the above value but may be between 0.1 to several hundred $\mu$m.

This substrate was oxidized in an oxygen atmosphere at 400° C. for one hour. The oxidization caused the inner wall of the pores in the porous Si layer to be covered with a thermally oxidized film. The surface of the porous Si layer was treated with hydrofluoric acid to remove only the oxidized film on the surface of the porous Si layer while leaving the oxidized film on the inner wall of the pores, and the CVD was then used to allow single crystal Si to epitaxially grow by 0.3 $\mu$m on the porous Si layer. The growth conditions are listed below.

Source gas: SiH$_2$Cl$_2$/H$_2$
Gas flow rate: 0.5/180 l/min.
Gas pressure: 80 Torr
Temperature: 950° C.
Growth speed: 0.3 $\mu$m/min.

Furthermore, a 200 nm thick oxide film (an SiO$_2$ layer) was formed on the epitaxial Si layer as an insulating layer, using thermal oxidation.

The surface of a separately prepared second Si substrate was placed on the surface of the SiO$_2$ layer to contact them mutually. These substrates were then subjected to thermal treatment at 1180° C. for 5 minutes for bonding.

The bonded substrate formed in this manner was separated using the apparatus shown in FIGS. 10A and 10B.

A shown in FIGS. 10A and 10B, the bonded wafer was allowed to stand in the vertical direction, and high-pressure pure water at 800 kgf/cm² was jetted against the gap in the wafer formed by bevelling, through a slit-like nozzle of 0.15 mm width and 50 mm length of the water jet apparatus located above or on the side of the wafer, from a direction parallel with the bonding interface (surface) in the bonded wafer. The slit was located parallel with the bonding interface (surface) in the bonded wafer and a linear flow of water was injected accurately against the gap in the wafer formed by bevelling. A plurality of nozzles were scanned in a direction in which the high-pressure pure water moved along the gap formed by bevelling.

This operation allowed the wafer to be separated into two via the porous Si layer.

As a result, the $SiO_2$ layer, the epitaxial Si layer, and part of the porous Si layer which were originally formed on the surface of the first substrate were transferred to the second substrate. Only the remaining part of the porous Si layer remained on the surface of the first substrate.

Subsequently, the porous Si layer transferred to the second substrate was selectively etched by being stirred using a mixture of 49% hydrofluoric acid and 30% hydrogen peroxide solution. The single crystal Si layer remained without being etched, whereas the porous Si layer was entirely removed by selective etching using the single crystal Si layer as an etch stop material.

The single crystal Si layer of 0.2 μm thickness was formed on the Si oxide film. The single crystal Si layer was not affected by the selective etching of the porous Si layer. When 100 points of the overall surface of the single crystal Si layer formed were measured for thickness, the value obtained was 201 nm±4 nm.

An observation of the cross section by the transmission electron microscope indicated that new crystal defects did not occur in the Si layer and that excellent crystallinity was maintained.

Thermal treatment was further carried out in hydrogen at 1100° C. for one hour and the surface roughness was evaluated using the interatomic force microscope. The mean square roughness of a 50-μm square region was about 0.2 nm and was similar to that of commercially available Si wafers.

Similar effects can be obtained by forming the oxide film on the surface of the second substrate instead of the surface of the epitaxial layer or forming it on both surfaces.

In addition, the porous Si layer remaining on the first substrate was selectively etched by being stirred using a mixture of 49% hydrofluoric acid and 30% hydrogen peroxide solution. Subsequently, using hydrogen annealing or surface treatment such as surface polishing, the first or second substrate could be reused to repeat the above process.

Similar results were obtained by separating wafers in which a separation layer was formed according to Examples 2 to 4.

EXAMPLE 11
(Quartz Substrate)

A light-transmissive substrate of quartz was prepared as a second substrate.

$N_2$ plasma processing was applied to the surface of the quartz prior to bonding and thermal treatment was carried out at 400° C. for 100 hours. Then, thermal treatment under hydrogen for flattening the SOI surface after separation was carried out at less than 1000° C., in this case, 970° C. for 4 hours.

The other process is the same as in Examples 1 to 10.

If a transparent substrate of an insulating material is used as the second substrate, the oxide film (the insulating layer) formed on the surface of the epitaxial Si layer in Examples 1 to 10 is not necessarily important. However, to space the epitaxial Si layer on which elements such as transistors will subsequently be formed, from the bonding interface to reduce the effects of impurities in the interface, the oxide film (the insulating layer) is preferably formed.

EXAMPLE 12
(GaAs on Si)

Examples 1 to 10 could be similarly implemented by forming the epitaxial layer of a compound semiconductor represented by GaAs.

In this case, the pressure of the water jet was maintained at 500 to 3,500 kgf/cm² and the nozzle had a diameter of 0.1 mm or more (half that of the total bonded wafer thickness).

The method for allowing the GaAs epitaxial layer to grow on the porous Si layer is not limited to the CVD method but may be implemented by various methods such as the MBE, sputtering, and liquid phase growth methods. The thickness of this layer is between several nm and several-hundred μm.

In each of these examples, the selective etching liquid for the ion implantation layer or porous layer is not limited to the mixture of 49% hydrofluoric acid and 30% hydrogen peroxide solution, but due to its enormous surface area, the porous Si layer can be etched using the following liquids:

Hydrofluoric acid;

Hydrofluoric acid+alcohol;

Hydrofluoric acid+alcohol+hydrogen peroxide solution;

Buffered hydrofluoric acid;

Buffered hydrofluoric acid+alcohol;

Buffered hydrofluoric acid+hydrogen peroxide solution;

Buffered hydrofluoric acid+alcohol+hydrogen peroxide solution;

a mixture of hydrofluoric, nitric, and acetic acids.

The other steps are not limited to the conditions in these examples but various other conditions can be used.

EXAMPLE 13
(Rotation of the Wafer)

A disc-like P-type single crystal Si wafer having a resistivity of 0.01 Ω·cm was prepared as a first Si substrate and had its surface subjected to anodization in an HF solution.

The anodization conditions are listed below.

Current density: 7 (mA·cm²)

Anodization solution: $HF:H_2O:C_2H_5OH=1:1:1$

Time: 11 (minute)

Thickness of the porous Si layer: 12 (μm)

This wafer was oxidized in an oxygen atmosphere at 400° C. for one hour. The oxidization caused the inner wall of the pores in the porous Si layer to be covered with a thermally oxidized film. The surface of the porous Si layer was treated with hydrofluoric acid to remove only the oxidized film on the surface of the porous Si layer while leaving the oxidized film on the inner wall of the pores, and the CVD was then used to allow single crystal Si to epitaxially grow by 0.3 μm on the porous Si layer. The growth conditions are listed below.

Source gas: $SiH_2Cl_2/H_2$

Gas flow rate: 0.5/180 l/min.

Gas pressure: 80 Torr

Temperature: 950° C.

Growth speed: 0.3 μm/min.

Furthermore, a 200 nm thick oxide film (an $SiO_2$ layer) was formed on the epitaxial Si layer as an insulating layer, using thermal oxidation.

Besides the first substrate formed in this manner, a disc-like Si wafer was prepared as a second Si substrate.

The surface of the second Si substrate was placed on the surface of the $SiO_2$ layer of the first Si substrate to contact them mutually. These substrates were then subjected to thermal treatment at 1180° C. for 5 minutes for bonding.

Next, preparations were made to separate the composite member consisting of the bonded wafer using the apparatuses shown in FIGS. 14, 15, and 17 to 20.

The wafer, which is the composite member, was located so as to stand in the vertical direction while fitting on the notch in the positioning base 35.

Pressurized air was supplied from the tubes 52 and 54 to the pressurizing passage 56, and the holding sections 45a and 46a were moved forward to the front and rear surfaces of the wafer, respectively, in order to abut the front and rear surfaces of the wafer with the holding surface of the holding sections 45a and 46a each having an opening op, respectively, as shown in FIG. 18.

Using the tubes 51 and 53, the wafer was sucked and fixed to the holding sections 45a and 46a. The supply of pressurized air was stopped and tension was supplied to the wafer in the opposite normal directions of the front and rear surfaces of the wafer using the springs 47 and 48.

With the shutter 61 closed, pure water without abrasive grains was fed forcefully from the pump 62 to the nozzle of 0.15 mm diameter and the pump 62 was operated to inject water at a pressure of about 200 kgf/cm$^2$.

The positioning base 35 was moved to its standby position, and the power to the motor 32 was turned on to transmit rotational drive force via the shaft 31 and belts 27 and 28 in order to rotate the holders 21 and 22.

Since the wafer was sucked by the holding sections 45a and 46a, it started to rotate simultaneously with the holders 21 and 22 at the same angular speed in the same direction.

Figure 19:
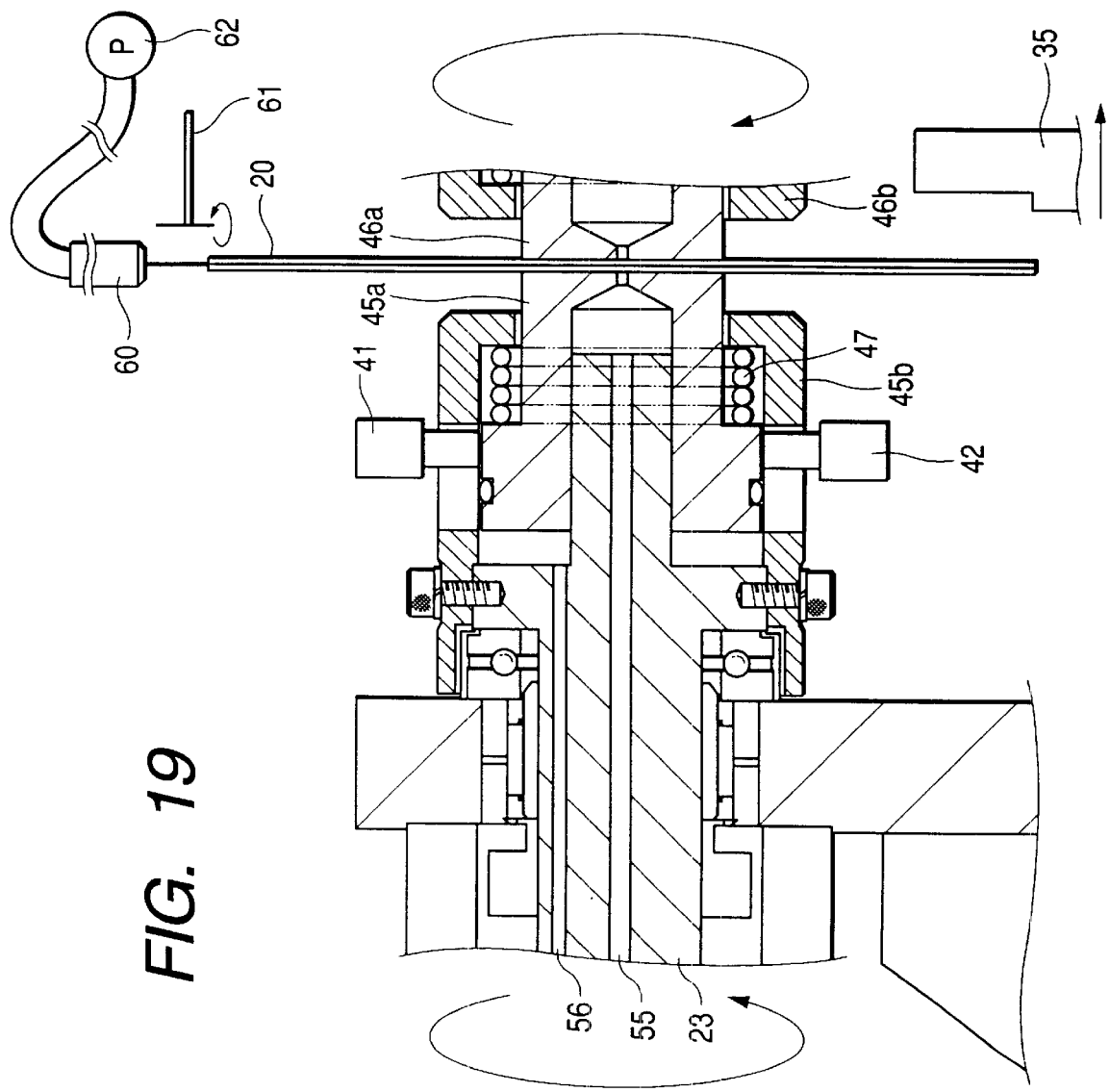
FIG. 19 is a sectional view of the separation apparatus shown in FIG. 15, in its separating-operation starting state.

The shutter 61 was opened to inject the water jet against the separation portion in the side of the wafer, as shown in FIG. 19.

Water from the water jet apparatus entered the pores in the separation portion to separate the wafer around the porous layer that is the separation portion.

Figure 20:
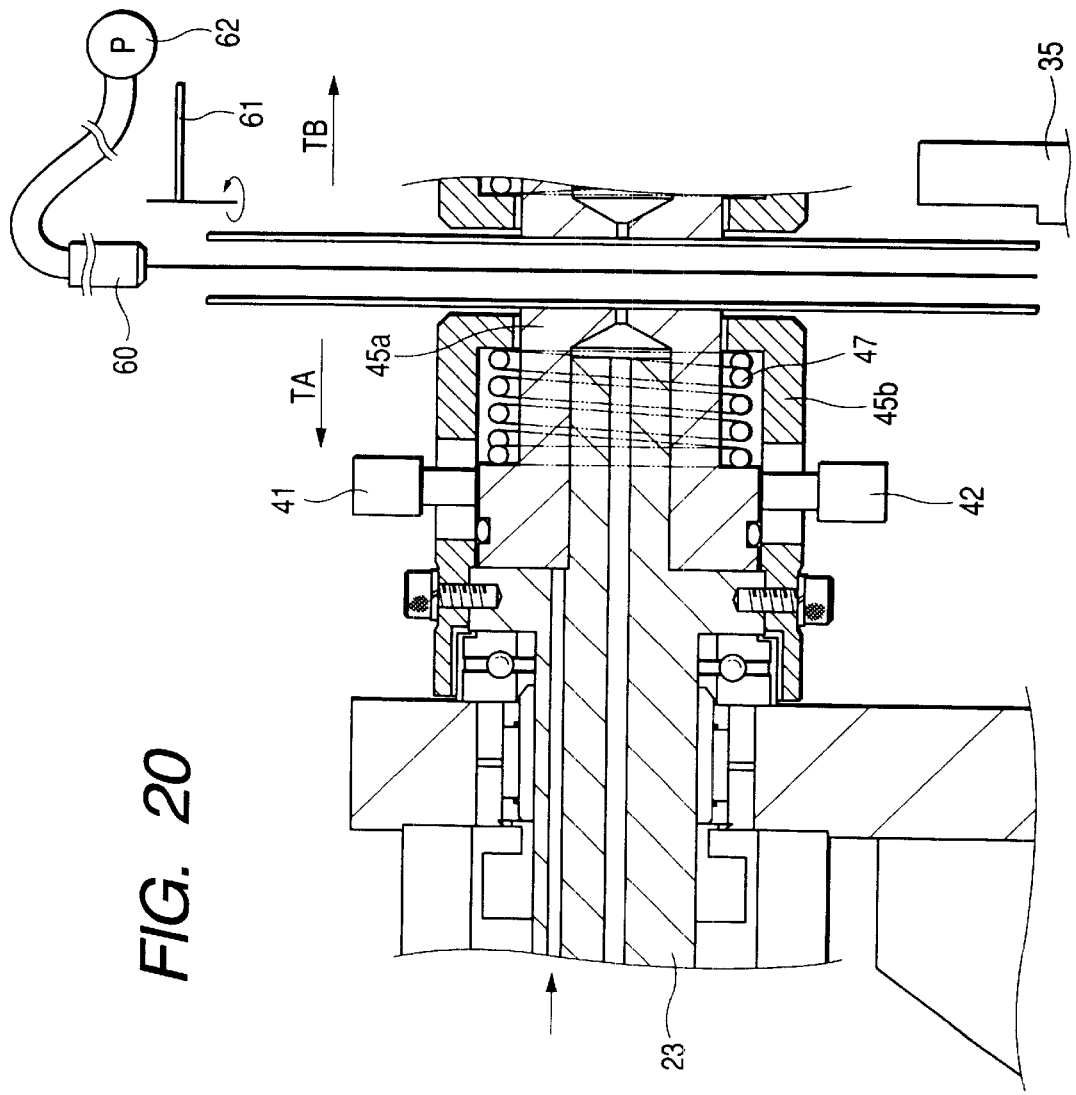
FIG. 20 is a sectional view of the separation apparatus shown in FIG. 15, in its separating-operation ending state.

As the injection of the water jet and the rotation of the wafer continue, the gap formed by separation gradually grew from the periphery of the wafer toward its rotational center and the wafer could be finally separated as shown in FIG. 20.

Since the wafer was subjected to forces in the directions shown arrows TA and TB in FIG. 20, the wafer was separated as shown in FIG. 20, simultaneously with the final separation of the rotational center of the wafer.

Subsequently, the forced feeding of water was stopped and the separated wafer was removed from the holding sections 45a and 46a.

Subsequently, the remaining porous Si layer transferred to the second substrate was selectively etched by being stirred using a mixture of 49% hydrofluoric acid and 30% hydrogen peroxide solution. The transferred single crystal Si layer under the porous layer remained without being etched, whereas the porous Si layer was entirely removed by selective etching using the single crystal Si layer as an etch stop material, thereby exposing the thin single crystal Si layer.

Thus, a first SOI substrate having the single crystal Si layer of 0.2 $\mu$m thickness on the Si oxide film of the second substrate was obtained. The single crystal Si layer was not affected by the selective etching of the porous Si layer. When 100 points of the overall surface of the single crystal Si layer formed were measured for thickness, the value obtained was 201 nm±2 nm.

An observation of the cross section by the transmission electron microscope indicated that new crystal defects did not occur in the Si layer and that excellent crystallinity was maintained.

Thermal treatment was further carried out in hydrogen at 1100° C. for 50 minutes and the surface roughness was evaluated using the interatomic force microscope. The mean square roughness of a 50-$\mu$m square region was about 0.2 nm.

In addition, the porous Si layer remaining on the first substrate was selectively etched by being stirred using a mixture of 49% hydrofluoric acid and 30% hydrogen peroxide solution. Subsequently, surface treatment such as polishing was carried out.

The first substrate, which had been polished, was again subjected to anodization to form a porous Si layer and nonporous single crystal Si was allowed to grow thereon. The surface of the nonporous single crystal Si layer, which had grown epitaxially, was oxidized. Then, the surface of a separately prepared Si wafer that was a third substrate was bonded on the oxidized surface of the single crystal Si layer of the first substrate.

The conditions for the above process were the same as those for the first bonded-wafer production.

The wafer was again separated in the same manner as in the first separation method described above to obtain a second SOI substrate having the single crystal Si layer on the insulating surface of the third substrate.

The above process was repeated to recycle the first substrate in order to fabricate a third and a fourth SOI substrates.

As described above, this invention enables a composite member having a separation region inside to be separated into a plurality of smaller members around the separation region without damaging or destructing those portions other than the separation region. Therefore, this invention enables semiconductor substrates with higher quality than the conventional ones to be fabricated easily and reliably with a high yield.

What is claimed is:

1. A method of separating a composite member having a plurality of members as mutually bonded, at a separation region including microcavities, distortions or defects which is a position different from the bonding position of the plurality of members, comprising jetting a fluid against a side surface of the composite member, the side surface having a recessed or narrow gap, to separate the composite member.

2. The method according to claim 1, wherein the composite member has inside one of the members a separation region containing microcavities and the fluid is jetted against the neighborhood of the separation region to separate it into the plurality of members around the separation region.

3. The method according to claim 2, wherein a recessed portion is formed near the separation region, the recessed portion receiving the fluid to extend the separation region.

4. The method according to claim 2, wherein the separation region has a lower mechanical strength than the bonding position.

5. The method according to claim 2, wherein the separation region comprises a porous layer formed by anodization.

6. The method according to claim 2, wherein the separation region can provide microcavities formed by ion implantation.

7. The method according to claim 1, wherein as the method of jetting the fluid a water jet method that jets a flow of high-pressure water from a nozzle is used.

8. Members obtained by the separation method according to claim 1.

9. A method of producing a semiconductor substrate comprising the steps of:

preparing on a substrate a first substrate having a porous single crystal semiconductor layer and a nonporous single crystal semiconductor layer provided on the porous single crystal semiconductor layer;

bonding the first substrate to a second substrate to form a composite member, the composite member having a recessed or narrow gap on a side surface thereof; and jetting a fluid to the vicinity of the porous single crystal semiconductor layer of the composite member to separate the composite member at the porous single crystal semiconductor layer.

10. The method according to claim 9, wherein a recessed portion is formed near the porous single crystal semiconductor layer of the composite member, the recessed portion receiving the fluid to extend the porous single crystal semiconductor layer.

11. The method according to claim 9, wherein the porous single crystal semiconductor layer has a lower mechanical strength than the bonding surface between the first and second substrates.

12. The method according to claim 9, wherein the porous single crystal semiconductor layer is formed by anodization.

13. The method according to claim 9, wherein as the method of jetting the fluid a water jet method that jets a flow of high-pressure water from a nozzle is used.

14. The method according to claim 9, wherein the first substrate is formed by partly making a single crystal silicon substrate porous to form a porous single crystal silicon layer and allowing a nonporous single crystal silicon layer to grow epitaxially on the porous single crystal silicon layer.

15. The method according to claim 14, wherein the first and second substrates are bonded mutually via at least one insulating layer and the insulating layer is formed by oxidizing the surface of the nonporous single crystal silicon layer.

16. The method according to claim 9, wherein the second substrate comprises a light-transmissive substrate.

17. The method according to claim 9, wherein the second substrate comprises a silicon substrate.

18. A method of producing a semiconductor substrate comprising the steps of:

implanting ions into a first substrate comprising a single crystal semiconductor at a predetermined depth to form an ion-implanted layer such that a microcavity layer can be obtained;

bonding the first substrate and a second substrate to each other via an insulating layer therebetween to form a composite member, the composite member having a recessed or narrow gap on a side surface thereof; and jetting a fluid against the vicinity of the ion-implanted layer of the composite member to separate the composite member at the ion-implanted layer.

19. The method according to claim 18, wherein a recessed portion is formed near the ion-implanted layer in the composite member, the recessed portion receiving the fluid to extend the ion-implanted layer.

20. The method according to claim 18, wherein the ion-implanted layer has a lower mechanical strength than the bonding surface between the first and second substrates.

21. The method according to claim 18, wherein as the method of jetting the fluid a water jet method that jets a flow of high-pressure water from a nozzle is used.

22. A semiconductor substrate produced by using the method according to claim 9.

23. A method of separating a composite member which is formed by bonding a first substrate comprising a non-porous layer on a porous layer formed by anodization to a second substrate so that the non-porous layer is positioned inside the composite member, comprising applying a pressure by a fluid to a side surface of the composite member, the side surface having a recessed or narrow gap, to separate the composite member at the porous layer.

24. A method of separating a composite member which is formed by bonding a first substrate comprising a non-porous layer on an ion-implanted layer to a second substrate so that the non-porous layer is positioned inside the composite member, comprising applying a pressure by a fluid to a side surface of the composite member, the side surface having a recessed or narrow gap, to separate the composite member at the ion-implanted layer.

* * * * *